(12) United States Patent
Kim et al.

(10) Patent No.: US 11,545,488 B2
(45) Date of Patent: Jan. 3, 2023

(54) INTEGRATED CIRCUIT AND SEMICONDUCTOR DEVICE INCLUDING SAME

(71) Applicant: SAMSUNG ELECTRONICS CO., LTD., Suwon-si (KR)

(72) Inventors: Chang-Bum Kim, Seoul (KR); Sunghoon Kim, Seongnam-si (KR); Daeseok Byeon, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 113 days.

(21) Appl. No.: 17/224,558

(22) Filed: Apr. 7, 2021

(65) Prior Publication Data

US 2022/0122967 A1    Apr. 21, 2022

(30) Foreign Application Priority Data

Oct. 20, 2020 (KR) .................. 10-2020-0135838

(51) Int. Cl.
| | |
|---|---|
| *H01L 27/07* | (2006.01) |
| *H01L 29/06* | (2006.01) |
| *H01C 1/012* | (2006.01) |
| *H01C 1/014* | (2006.01) |
| *H01C 7/00* | (2006.01) |
| *H01C 13/02* | (2006.01) |
| *H01L 49/02* | (2006.01) |

(52) U.S. Cl.
CPC ......... *H01L 27/0738* (2013.01); *H01C 1/012* (2013.01); *H01C 1/014* (2013.01); *H01C 7/00* (2013.01); *H01C 7/006* (2013.01); *H01C 13/02* (2013.01); *H01L 29/0688* (2013.01); *H01L 28/20* (2013.01)

(58) Field of Classification Search
CPC .......... H01C 1/012; H01C 1/014; H01C 7/00; H01C 7/006; H01C 13/02; H01L 27/0738; H01L 29/0688
See application file for complete search history.

(56) References Cited

U.S. PATENT DOCUMENTS

| | | | |
|---|---|---|---|
| 5,805,428 A | 9/1998 | Singer | |
| 6,614,077 B2 * | 9/2003 | Nakamura | .......... H01L 29/7393 257/341 |
| 6,700,156 B2 * | 3/2004 | Saitoh | .................. H01L 29/7813 257/E29.066 |
| 6,911,360 B2 | 6/2005 | Li et al. | |
| 7,729,195 B2 | 6/2010 | Youn et al. | |

(Continued)

FOREIGN PATENT DOCUMENTS

| | | |
|---|---|---|
| KR | 1019980020089 A | 6/1998 |
| KR | 1020080092117 A | 10/2008 |
| KR | 1020080100949 A | 11/2008 |

*Primary Examiner* — Kyung S Lee
(74) *Attorney, Agent, or Firm* — Volentine, Whitt & Francos, PLLC

(57) ABSTRACT

An integrated circuit includes; a substrate including a single active region, a first active resistor formed on the substrate, and a transistor including a first junction area in the single active region. The first active resistor and the transistor are electrically connected through the first junction area. The first active resistor is formed between a first node and a second node included in the first junction area. The first node is connected to a first contact, and the second node is connected to a second contact.

20 Claims, 16 Drawing Sheets

(56) References Cited

U.S. PATENT DOCUMENTS

| | | | |
|---|---|---|---|
| 7,919,821 B2 | 4/2011 | Li et al. | |
| 8,022,477 B2* | 9/2011 | Akagi | H01L 29/7824 |
| | | | 438/282 |
| 9,230,720 B2 | 1/2016 | Santangelo et al. | |
| 9,929,135 B2 | 3/2018 | Tanuma et al. | |
| 9,929,142 B2* | 3/2018 | Ivanov | H01L 27/0262 |
| 10,109,621 B2 | 10/2018 | Lee | |
| 2001/0025987 A1* | 10/2001 | Akaishi | H01L 21/266 |
| | | | 257/E29.066 |
| 2003/0047782 A1* | 3/2003 | Hasegawa | H01L 27/1203 |
| | | | 257/E21.703 |
| 2015/0295026 A1* | 10/2015 | Chang | H01L 29/0692 |
| | | | 257/341 |
| 2019/0189191 A1 | 6/2019 | Won et al. | |

* cited by examiner

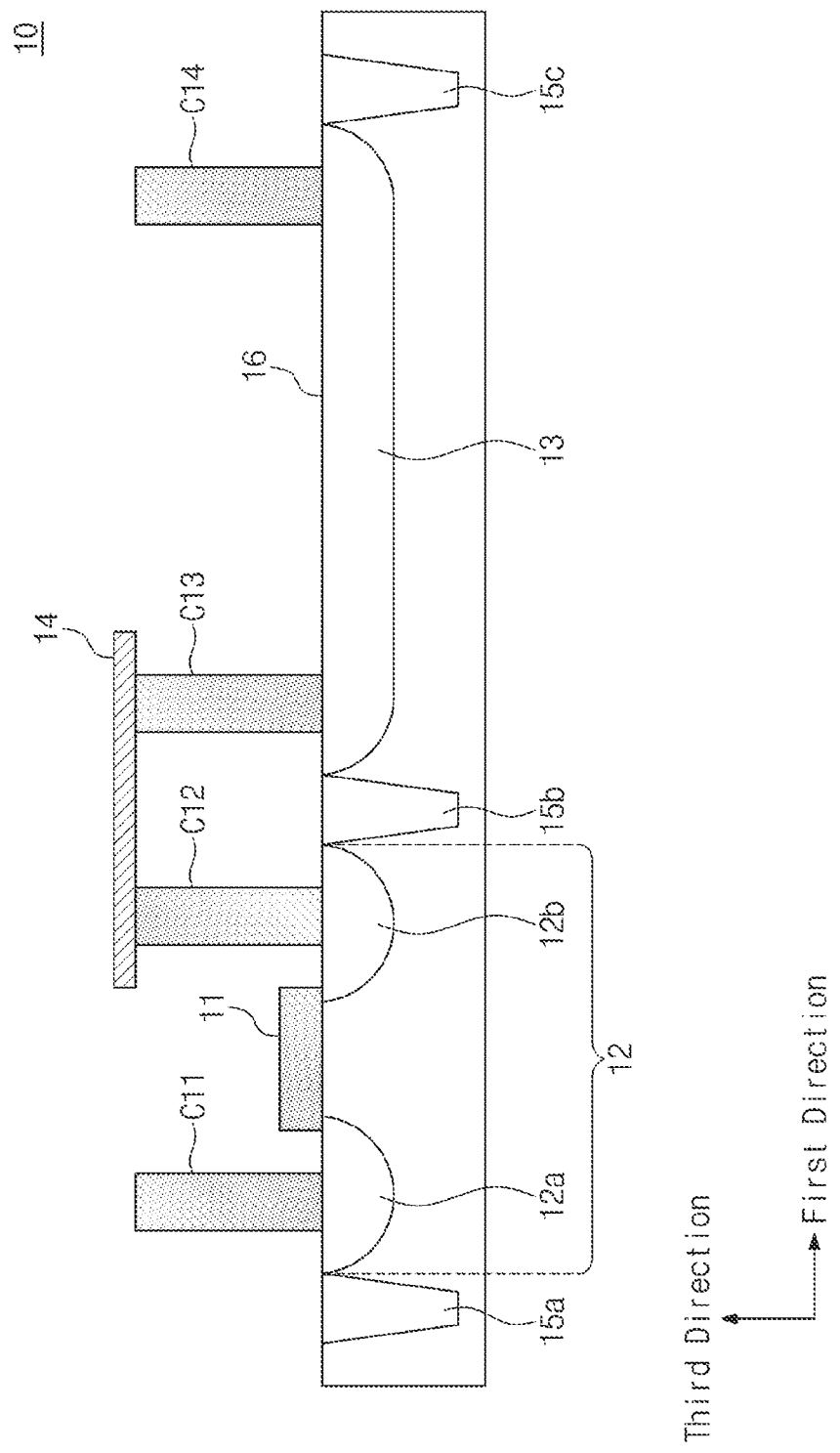

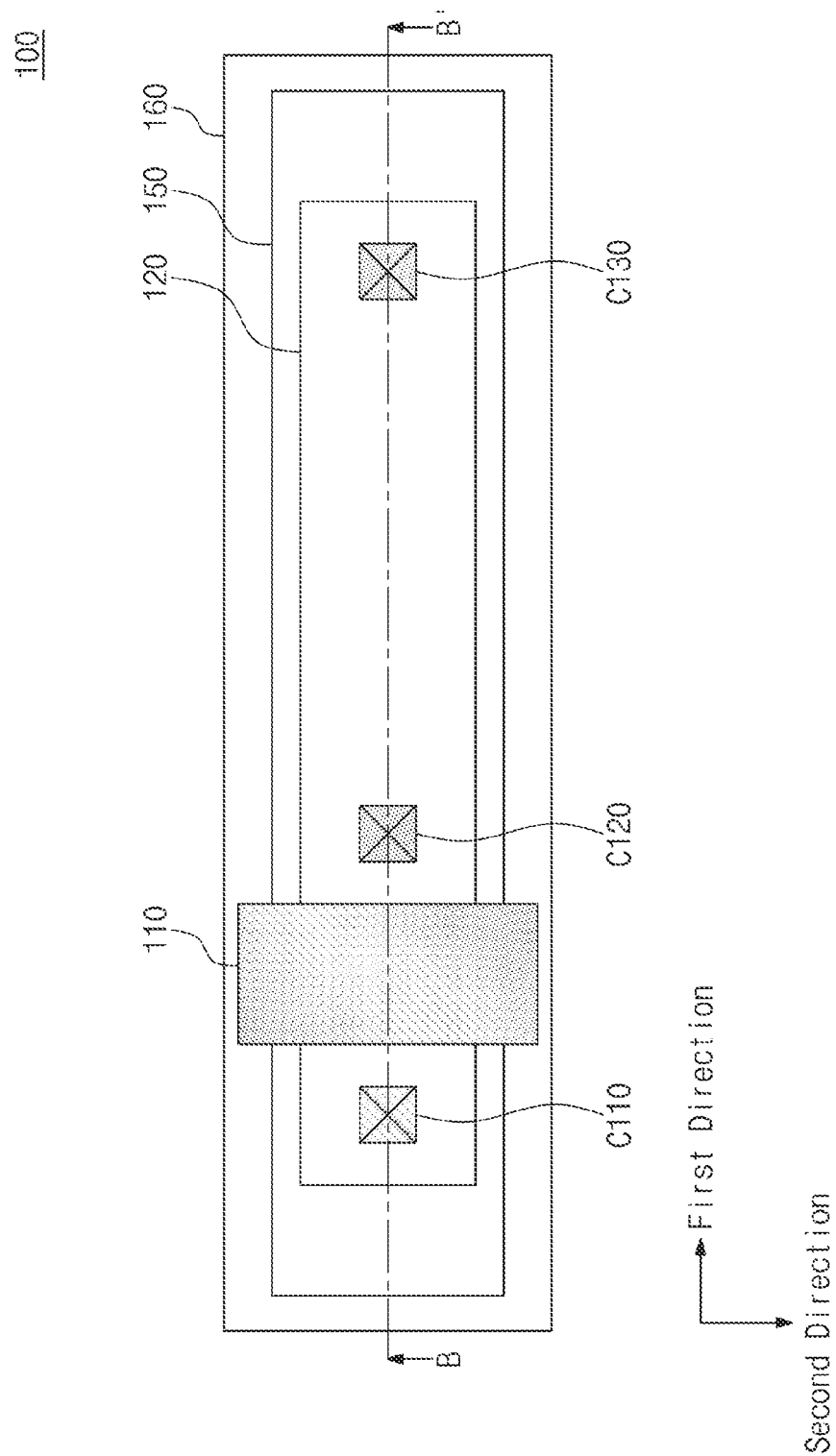

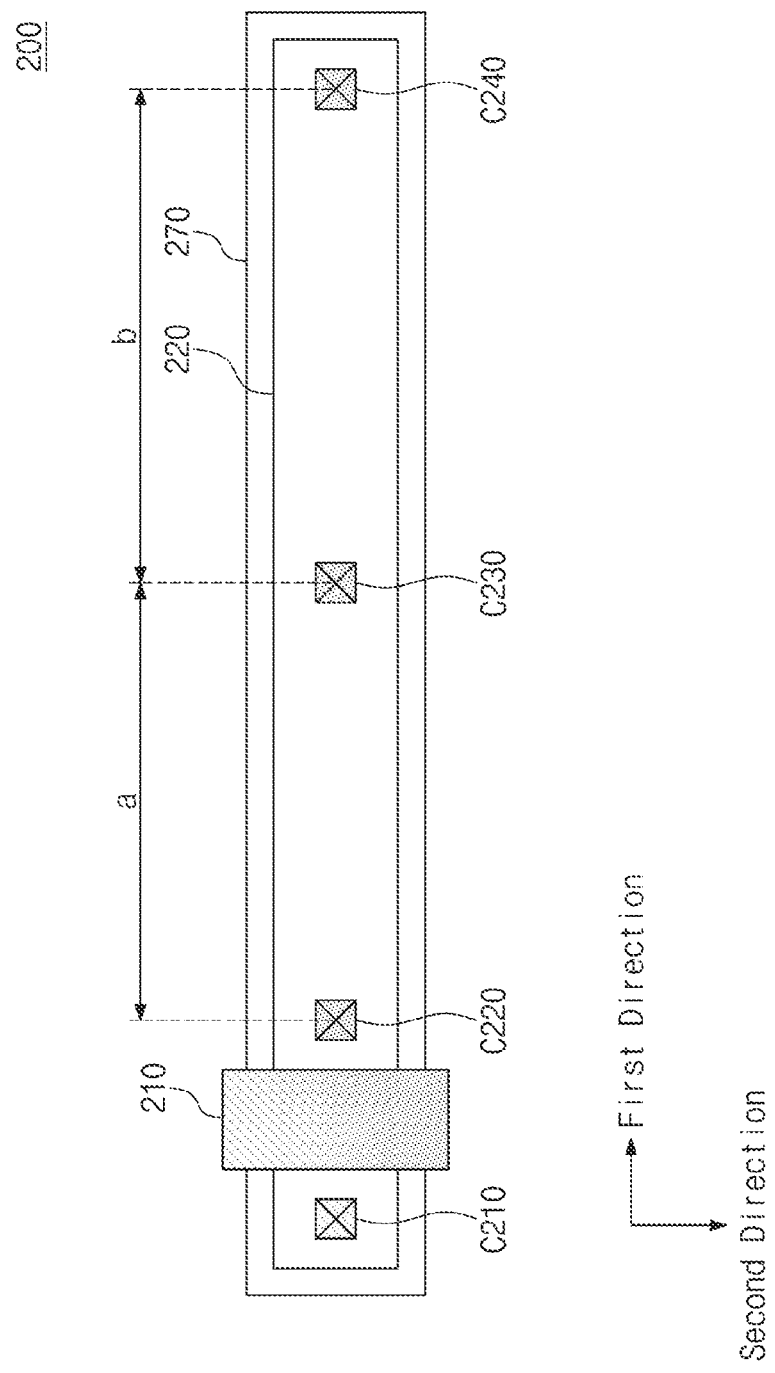

INTEGRATED CIRCUIT AND SEMICONDUCTOR DEVICE INCLUDING SAME

CROSS-REFERENCE TO RELATED APPLICATIONS

This application claims priority under 35 U.S.C. § 119 to Korean Patent Application No. 10-2020-0135838 filed on Oct. 20, 2020 in the Korean Intellectual Property Office, the subject matter of which is hereby incorporated by reference.

BACKGROUND

Embodiments of the inventive concept relate generally to semiconductor integrated circuits, and more particularly, to integrated circuits including an active region, as well as semiconductor devices including same.

As semiconductor process technologies develop, a size of a transistor may gradually decrease, and the number of transistors integrated in a semiconductor device may also increase. For example, a system-on-chip (SoC) that refers to one chip or integrated circuit (IC) in which all components of a computer or any other electronic system are integrated is widely used in various applications. As the performance requirements for an application expand, the constituent semiconductor device tend to include more and more elements and components.

For example, in a semiconductor device such as a divider, transistors may be respectively disposed at nodes of an active resistor chain to select and use a desired voltage level through an ON/OFF control of the transistors. In such cases, a transistor is connected to an active resistor through a metal wire. However, unintended noise may arise and be applied to a voltage level depending in relation to the metal wire.

SUMMARY

Embodiments of the inventive concept provide an integrated circuit capable of blocking a noise due to a wire by removing a metal wire from a layout of a semiconductor integrated circuit and a semiconductor device including the same.

According to an embodiment, an integrated circuit includes; a substrate including a single active region, a first active resistor formed on the substrate, and a transistor including a first junction area in the single active region. The first active resistor and the transistor are electrically connected through the first junction area, the first active resistor is formed between a first node and a second node included in the first junction area, the first node is connected to a first contact, and the second node is connected to a second contact.

According to an embodiment, an integrated circuit includes; a substrate including a single active region, a plurality of active resistors formed on the substrate, and a plurality of transistors sharing a first junction area included in the single active region. The plurality of active resistors and the plurality of transistors are electrically connected through the first junction area, the first junction area includes a plurality of nodes, and each one of the plurality of active resistors is alternately disposed with each one of the plurality of nodes.

According to an embodiment, a semiconductor device includes; a substrate including a single active region, and a plurality of sub-circuits. The semiconductor device distributes a uniform voltage to each one of the plurality of sub-circuits. Each one of the plurality of sub-circuits includes an active resistor formed on the substrate, and a transistor including a first junction area included in the single active region, the active resistor and the transistor are electrically connected through the first junction area, the first junction area includes a first node and a second node, and the active resistor is formed between the first node and the second node.

BRIEF DESCRIPTION OF THE DRAWINGS

The above and other objects and features of the inventive concept will become apparent upon consideration of the following detailed description together with the accompanying drawings, in which:

FIGS. 1A, 1B and 1C illustrate an integrated circuit including a metal line as a comparative example in relation to embodiments of the inventive concept;

FIGS. 2A, 2B, 2C, 3, 4, and 5 variously illustrate integrated circuits according to embodiments of the inventive concept;

DETAILED DESCRIPTION

Throughout the written description and drawings, like (or analogous) reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

As noted in the some of the accompanying drawings, certain embodiments of the inventive concept (as well as the comparative example of FIGS. 1A, 1B and 1C) are illustrated in relation to an assigned set of directions (e.g., a first (horizontal) direction, a second (horizontal) direction and a third (vertical) direction that intersects a horizontal plane defined by the first and second directions. However, those skilled in the art will recognize that these directions are arbitrary in nature and merely provided for clarity of illustration and explanation.

Figure 1A:
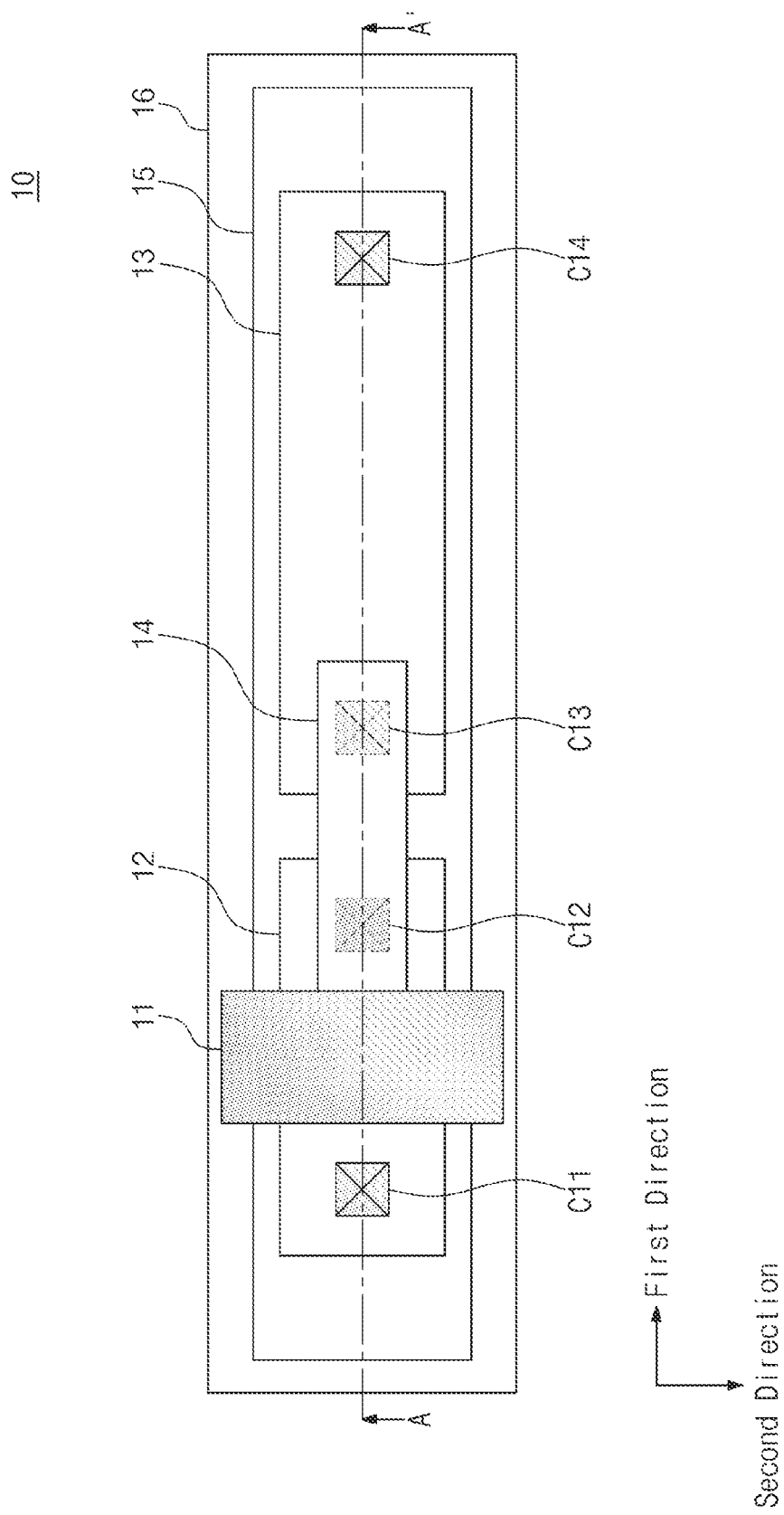
Figure 1C:
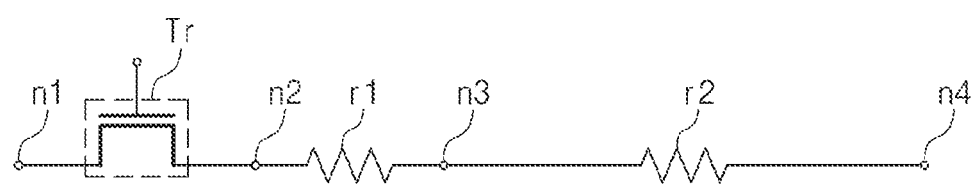

Figures (FIGS. 1A, 1B and 1C illustrate an integrated circuit, which serves as a comparative example in relation to embodiments of the inventive concept. Here, FIG. 1A is a layout (or top-down) view of an integrated circuit 10, FIG. 1B is a cross-sectional view of the integrated circuit 10 taken along line A-A' of FIG. 1A, and FIG. 1C is an equivalent circuit diagram for the integrated circuit 10 of FIG. 1A. In this context, the term "integrated circuit" refers to any circuit including a transistor and an active resistor integrated on a semiconductor substrate.

Referring collectively to FIGS. 1A, 1B and 1C, the integrated circuit 10 may include a gate 11 of a transistor Tr, a first active region 12, a second active region 13, contacts C11, C12, C13, and C14, a metal line 14, a device isolation layer 15, and a substrate 16. The first active region 12 may include a first junction area 12a and a second junction area 12b associated with the transistor Tr. The second active region 13 may include an active resistor r2.

The first active region 12 and the second active region 13 may be separated by a device isolation layer 15. In this regard, the device isolation layer 15 may include first, second and third device isolation layers 15a, 15b, and 15c. For example, the first active region 12 may be isolated between the first device isolation layer 15a and the second device isolation layer 15b, and the second active region 13 may be isolated between the second device isolation layer 15b and the third device isolation layer 15c.

The contacts C11, C12, C13, and C14 may be used to variously interconnect the transistor Tr and the active resistor r2, as well as connect the transistor Tr and/or the active resistor r2 with external components. For example, the second contact C12 may electrically connect the second junction area 12b of the transistor Tr, and the third contact C13 may electrically connect the second active region 13. The metal line 14 may be disposed above the substrate 16 on upper portions of the second contact C12 and the third contact C13 to electrically connect the transistor Tr and the active resistor r2.

In this regard, the metal line 14 may form different resistors depending on its shape, constituent material(s) and disposition. However, resistance of the metal line 14 may become a source of noise within a semiconductor device including the active resistor r2. Thus, referring to FIG. 1C, the integrated circuit 10 may further (and undesirably) include a noise resistor r1 associated with the metal line 14 in addition to the transistor Tr and the active resistor r2.

Further in this regard, the integrated circuit 10 may be understood as including first, second, third and fourth nodes n1, n2, n3, and n4, wherein the first node n1 is connected to the first junction area 12a of the transistor Tr, the second node n2 is connected between the second junction area 12b of the transistor Tr and the noise resistor r1, the third node n3 is connected between the noise resistor r1 and the active resistor r2, and the fourth node n4 is connected to the active resistor r2.

In a semiconductor device implemented with multiple active resistors and multiple metal lines, the resulting noise associated with the metal lines may become significant, and may in extreme conditions cause operating issues for various circuits and sub-circuits. For example, a voltage divider including an active resistor chain may be used to extract a target voltage in response to a code control, wherein transistors are respectively connected to division nodes. Accordingly, noise associated with metal lines may be applied to an output voltage, and this noise may adversely affect the linearity of the output voltage, thereby causing a reduction in the reliability of the code control.

From the foregoing, those skilled in the art will recognize a need to reduce (or eliminate) the noise-influence of the metal line 14 connecting the active resistor r2 and the transistor Tr in the integrated circuit 10. Fortunately, integrated circuits according to embodiments of the inventive concept, a number of which will be described hereafter, may be used to minimize the use of (and the noise-influence of) metal lines by connecting a transistor and an active resistor using an active region, instead of a metal line. As a result, the noise conventionally associated with metal lines connecting a resistor and a transistor may obviated.

Figure 2B:
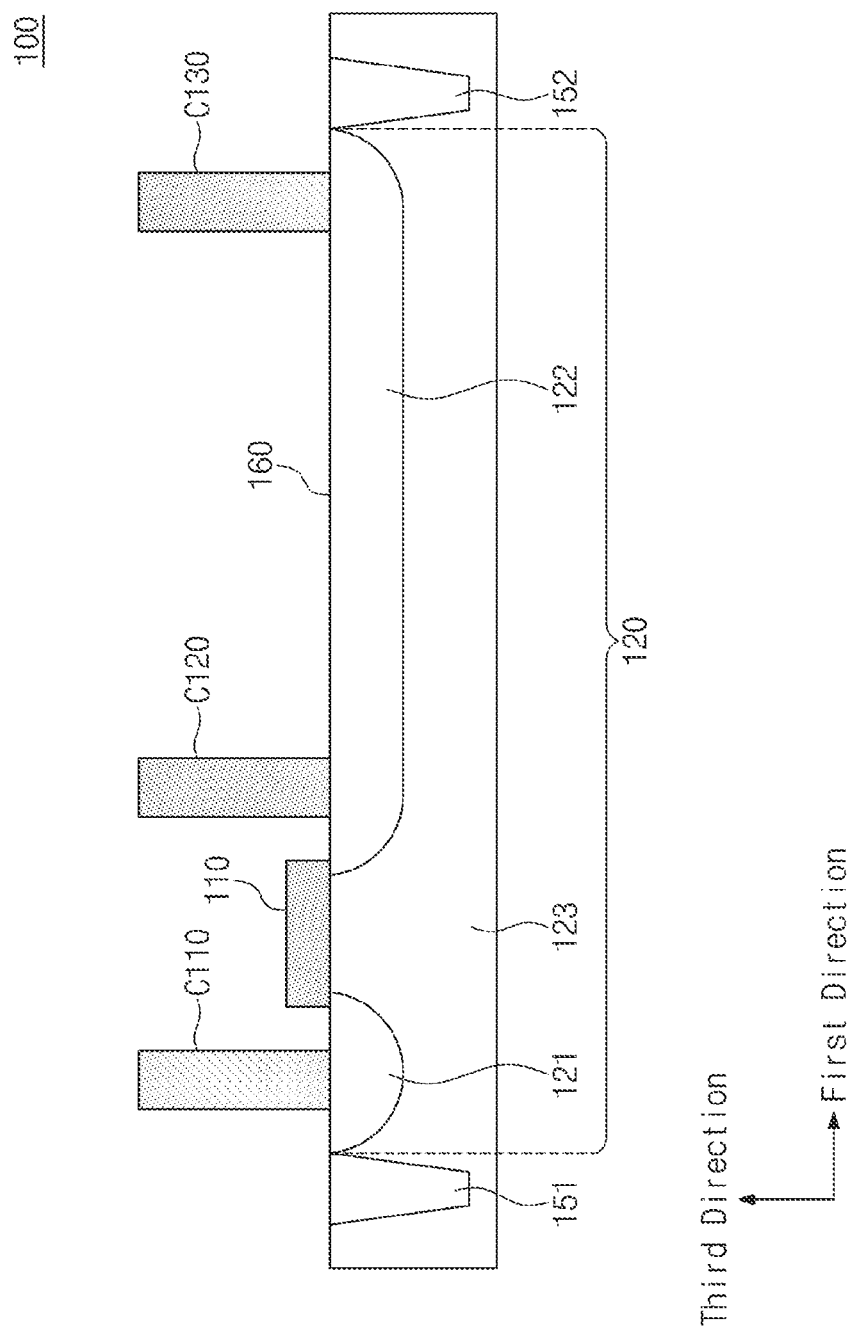
Figure 2C:
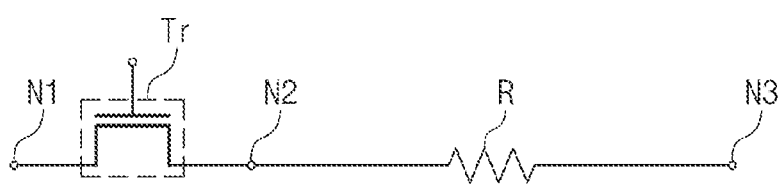

FIGS. 2A, 2B and 2C illustrate an integrated circuit according to embodiments of the inventive concept. Here, FIG. 2A is a layout view illustrating an integrated circuit 100, FIG. 2B is a cross-sectional view of the integrated circuit 100 taken along line B-B' of FIG. 2A, and FIG. 2C is an equivalent circuit diagram for the integrated circuit 100 of FIG. 2A.

Referring to FIGS. 2A, 2B and 2C, the integrated circuit 100 may include a gate 110 of a transistor Tr, an active region 120, contacts C110, C120, and C130, a device isolation layer 150 and a substrate 160.

Thus, the transistor Tr may include the gate 110 and a source/drain area. For example, the transistor Tr may be a P-type Metal Oxide Semiconductor (PMOS) transistor formed on an N-well or an N-type MOS (NMOS) transistor formed on a P-well. However, for purposes of the illustrated example shown in FIGS. 2A, 2B and 2C, it is assumed that the transistor Tr is an NMOS transistor. The gate 110 may be disposed on the active region 120, and the source/drain area may be included in the active region 120.

The active region 120 may include a first junction area 121, a second junction area 122, and a P-well region 123. The first junction area 121 and the second junction area 122 may be areas in which N-type impurities have been selected deposited, the first junction area 121 may correspond to the source area of the transistor Tr, and the second junction area 122 may correspond to the drain area of the transistor Tr. Alternatively, the first junction area 121 may correspond to the drain area of the transistor Tr, and the second junction area 122 may correspond to the source area of the transistor Tr.

The active region 120 may include an active resistor "R". Each of the first junction area 121, the second junction area 122, and the P-well region 123 may include an active resistor. However, because concentrations of dopant(s) in the first junction area 121 and the second junction area 122 are so much higher than the concentration of dopant(s) in the P-well region 123, an active resistor associated with the P-well region 123 may be ignored. Also, because the second junction area 122 is relatively greater (e.g., wider) than the first junction area 121, an active resistor associated with the first junction area 121 will be relatively small, as compared with the active resistor associated with the second junction area 122. Therefore, unless otherwise described, the active resistor R associated with the active region 120 will be referred to as an "active resistor associated with the second junction area 122."

The active region 120 may be formed on the substrate 160 and may be defined by the device isolation layer 150. For example, the active region 120 may be isolated by the device isolation layer 150. That is, in some embodiments, the device isolation layer 150 may completely surround the active region 120. However, referring to FIG. 2B, the active region 120 may be understood as an area between a first device isolation layer 151 and a second device isolation layer 152.

The contacts associated with the illustrated embodiment of FIGS. 2A, 2B and 2C are assumed to include the first contact C110, the second contact C120, and the third contact C130, but those skilled in the art will recognize that the number and disposition of contacts will vary by design. Here, however, the first contact C110 may be disposed on the first junction area 121 to electrically connect an external component to the integrated circuit 100. The second contact C120 may be disposed on the second junction area 122 to receive a voltage input to the integrated circuit 100, and the third contact C130 may be disposed on the second junction area 122 to output a voltage from the integrated circuit 100.

Thus, the first contact C110 may be understood as being connected to a first node N1, the second contact C120 may be understood as being connected to a second node N2, and the third contact C130 may be understood as being connected to a third node N3. Accordingly, the voltage input to the second contact C120 may determine a potential apparent at the second node N2. In some embodiments, one or more of the foregoing nodes may be associated with a contact structure.

In this regard, the first junction area 121 may include the first node N1, and the second junction area 122 may include the second node N2 and the third node N3. In the illustrated embodiment of FIGS. 2A, 2B and 2C, the second junction area 122 is assumed to extend in the first direction, wherein the second node N2 and the third node N3 may are spaced apart in the second junction area 122 in the first direction. As a result, the active resistor R may be understood as being substantially interposed between the second node N2 and the third node N3.

A "length" (as measured in the first direction) of the second junction area 122 may be greater than a length of the first junction area 121. In this regard, the length of the second junction area 122 may extend from the gate 110 to the second device isolation layer 152, such that a distance from the gate 110 to the second device isolation layer 152 is greater than a distance from the gate 110 to the first device isolation layer 151. Accordingly, in the integrated circuit 100, the gate 110 may be disposed nearer to the first device isolation layer 151 than the second device isolation layer 152.

With the foregoing configuration in mind, the second junction area 122—substantially providing the active resistor R—may be understood that the "single active region" 120 includes the transistor Tr and the active resistor R. That is, the active region 120 may include the transistor Tr and the active resistor R without provision of a connecting metal line, like the metal line 14 shown in the comparative example of FIG. 1B. As such, the integrated circuit 100 may avoid the occurrence of the noise resistor r1 and its resulting noise-influence. In addition, a distance between the transistor Tr and the active resistor R may be decreased by elimination of the metal line 14, thereby allowing the overall size of the integrated circuit 100 to be reduced.

Referring to FIG. 2C, the equivalent circuit diagram of the integrated circuit 100 includes the transistor Tr, the active resistor R, the first node N1, the second node N2 and the third node N3, wherein the transistor Tr may include the gate 110, the first junction area 121 and the second junction area 122. The active resistor R may substantially result from the dopant concentration(s) formed in the second junction area 122.

The first node N1 may be connected to a first end of the transistor Tr, and the second node N2 may be connected to a second (opposing) end of the transistor Tr as well as a first end of the active resistor R. The third node N3 may be connected to a second (opposing) end of the active resistor R. Thus, the transistor Tr may be interposed between the first node N1 and the second node N2, and the active resistor R may be interposed between the second node N2 and the third node N3.

Because the second junction area 122 includes the second node N2 and the third node N3, the active resistor R may be electrically connected to the transistor Tr by the second junction area 122. That is, the transistor Tr and the active resistor R may be electrically connected through the single active region 120.

With this configuration, it follows that the integrated circuit 100 may electrically connect the transistor Tr with the active resistor R through a single node. As a result, the number of nodes between the transistor Tr and the active resistor R may decrease, as compared with the comparative example including the metal line 14 illustrated in FIGS. 1A, 1B and 1C. And as a further result, the noise resistor r1 associated with the metal line 14—conventionally existing between the transistor Tr and the active resistor r2—may be obviated. And as a still further result, the second node n2 that conventionally exists between the transistor Tr and the active resistor R may be eliminated.

Hence, because the active resistor R and the transistor Tr are connected to the single active region 120 (e.g., the second junction area 122) no noise resistor arises, and conventionally apparent second node n2 and the third node n3 (see, FIG. 1C) may be integrated to the second node N2 of FIG. 2C as a junction area, thereby enlarging (e.g., elongating) a source/drain area associated with the transistor Tr.

Figure 4:
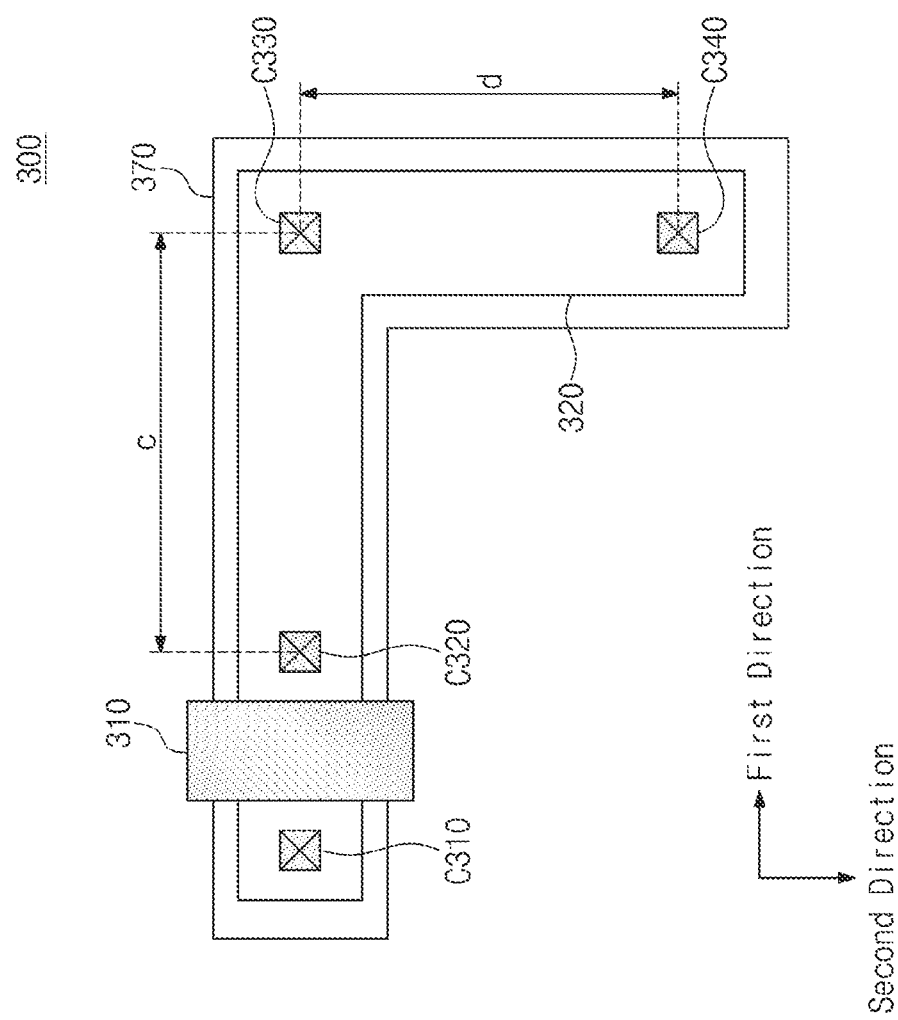
Figure 5:
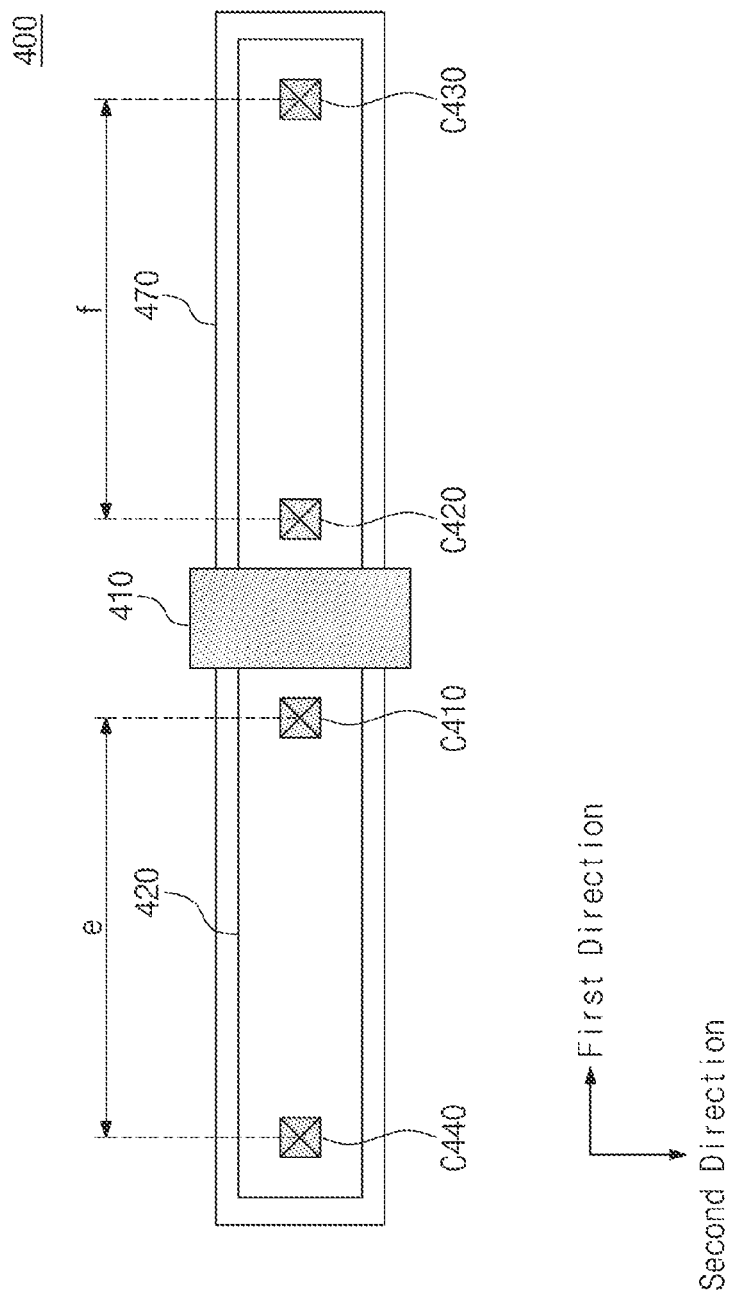

FIGS. 3, 4, and 5 variously illustrate integrated circuits according to embodiments of the inventive concept Referring to FIGS. 2A and 3, an integrated circuit 200 may include a gate 210, an active region 220, contacts C210, C220, C230, and C240, a device isolation layer 270 and a substrate (not illustrated). The structure of the integrated circuit 200 may be substantially similar to the structure of the integrated circuit 100 of FIG. 2A, except that the second junction area 122 is further extended.

In this regard, the gate 210, the first contact C210, the second contact C220, the fourth contact C240, and the device isolation layer 270 shown in FIG. 3 respectively correspond to the gate 110, the first contact C110, the second contact C120, the third contact C130, and the device isolation layer 150 shown in FIG. 2A.

However, the single active region 220 may include a first junction area and a second junction area. That is, the active region 220 may be enlarged by elongating the second junction area in the first direction. The active region 220 may also include the third contact C230, wherein the third contact C230 is interposed between the second contact C220 and the fourth contact C240 (e.g., for the purpose of dividing an active resistor). The third contact C230 may be connected to an external component.

The first contact C210 may be disposed on the first junction area. The first junction area may include a first node corresponding to the first contact C210. The second, third, and fourth contacts C220, C230, and C240 may be disposed on the second junction area. The second junction area may include second, third, and fourth nodes corresponding to the second, third, and fourth contacts C220, C230, and C240, respectively.

A first length "a" between the second contact C220 and the third contact C230 may be the same as or different from a second length "b" between the third contact C230 and the fourth contact C240. For example, the first length between the second contact C220 and the third contact C230 may be the same as the second length between the third contact C230 and the fourth contact C240 when resistors having the same resistance value are implemented. Alternately, the first length between the second contact C220 and the third contact C230 may be different from the second length between the third contact C230 and the fourth contact C240 when resistors having different resistance values are implemented.

That is, the first length between the second contact C220 and the third contact C230 may determine a first active resistor between the second node and the third node, and the second length between the third contact C230 and the fourth contact C240 may determine a second active resistor between the third node and the fourth node. The first active resistor and the second active resistor may be electrically connected to the transistor Tr through the single active region 220. In this manner, an input voltage applied to the second contact C220 may be divided in accordance with a resistance ratio between the first active resistor and the second active resistor.

In some embodiments, the third contact C230 may be omitted. In such cases, the first active resistor and the second active resistor may be integrated, and the integrated circuit 200 may include a large active resistor, as compared with the integrated circuit 100 of FIG. 2A.

Referring to FIGS. 2A, 3, and 4, an integrated circuit 300 may include a gate 310, an active region 320, contacts C310, C320, C330, and C340, a device isolation layer 370 and a substrate (not illustrated). Here, the integrated circuit 300 may be substantially similar to the integrated circuit 100 of FIG. 3, except that the second junction area extends in the second direction instead of the first direction.

In this regard, the gate 310, the first contact C310, the second contact C320, the third contact C330, the fourth contact C340, and the device isolation layer 370 of FIG. 4 respectively correspond to the gate 210, the first contact C210, the second contact C220, the third contact C230, the fourth contact C240, and the device isolation layer 270 of FIG. 3.

Here, the single active region 320 initially extends in the first direction and then further extends in the second direction. In this regard, the active region 320 may be further extended in the second direction by elongating a second junction area in the second direction.

The active region 320 may include the third contact C330 for the extension in the second direction. The second contact C320 and the third contact C330 may be arranged in the first direction, and the third contact C330 and the fourth contact C340 may be arranged in the second direction. The active region 320 may extend from the third contact C330 in the second direction. For example, the active region 320 may extend from the second contact C320 to the third contact C330 in the first direction and may then extend from the third contact C330 to the fourth contact C340 in the second direction.

The first contact C310 may be disposed on a first junction area of the active region 320. The first junction area may include a first node corresponding to the first contact C310. The second, third, and fourth contacts C320, C330, and C340 may be disposed on the second junction area of the active region 320. The second junction area may include second, third, and fourth nodes corresponding to the second, third, and fourth contacts C320, C330, and C340, respectively.

A first length "c" between the second contact C320 and the third contact C330 may be the same as, or different from a second length "d" between the third contact C330 and the fourth contact C340. Here, as before, the first length between the second contact C320 and the third contact C330 may determine a first active resistor between the second node and the third node, and the second length between the third contact C330 and the fourth contact C340 may determine a second active resistor between the third node and the fourth node. The first active resistor and the second active resistor may be electrically connected to the transistor Tr through the active region 320.

Referring to FIGS. 2A, 3, and 5, an integrated circuit 400 may include a gate 410, an active region 420, contacts C410, C420, C430, and C440, a device isolation layer 470 and a substrate (not illustrated). Here, the integrated circuit 400 may be substantially similar in structure to the integrated circuit 100 of FIG. 2A, except that a first junction area extends in the "positive" first direction and in the "negative" (opposite to the positive) first direction. That is, the integrated circuit 400 of FIG. 5 is substantially similar to the integrated circuit 200 of FIG. 3, except for the extension direction of the first junction area.

In this regard, the gate 410, the first contact C410, the second contact C420, the third contact C430, and the device isolation layer 470 of FIG. 5 correspond respectively to the gate 210, the first contact C210, the second contact C220, the third contact C230, and the device isolation layer 270 of FIG. 3.

The single active region 420 extends in both the positive and the negative first direction. That is, the active region 420 may extend in the negative first direction as well as the positive first direction by elongating a first junction area in the negative first direction.

The single active region 420 may include the fourth contact C440 for the extension in the negative first direction. The first contact C410 and the fourth contact C440 may be arranged in the negative first direction, and the second contact C420 and the third contact C430 may be arranged in the positive first direction. For example, the active region 420 may extend from the second contact C420 to the third contact C430 in the positive first direction and may extend from the first contact C410 to the fourth contact C440 in the negative first direction.

The first contact C410 and the fourth contact C440 may be disposed on the first junction area of the active region 420. The first junction area may include a first node and a fourth node corresponding to the first contact C410 and the fourth contact C440, respectively. The second contact C420 and the third contact C430 may be disposed on a second junction area of the active region 420. The second junction area may include a second node and a third node corresponding to the second contact C420 and the third contact C430, respectively.

A first length "e" between the first contact C410 and the fourth contact C440 may be the same as, or different from a second length "f" between the second contact C420 and the third contact C430. Here, the first length between the first contact C410 and the fourth contact C440 may determine a first active resistor between the first node and the fourth node, and the second length between the second contact C420 and the third contact C430 may determine a second active resistor between the second node and the third node. The first active resistor and the second active resistor may be electrically connected to the transistor Tr through the active region 420.

Figure 6A:
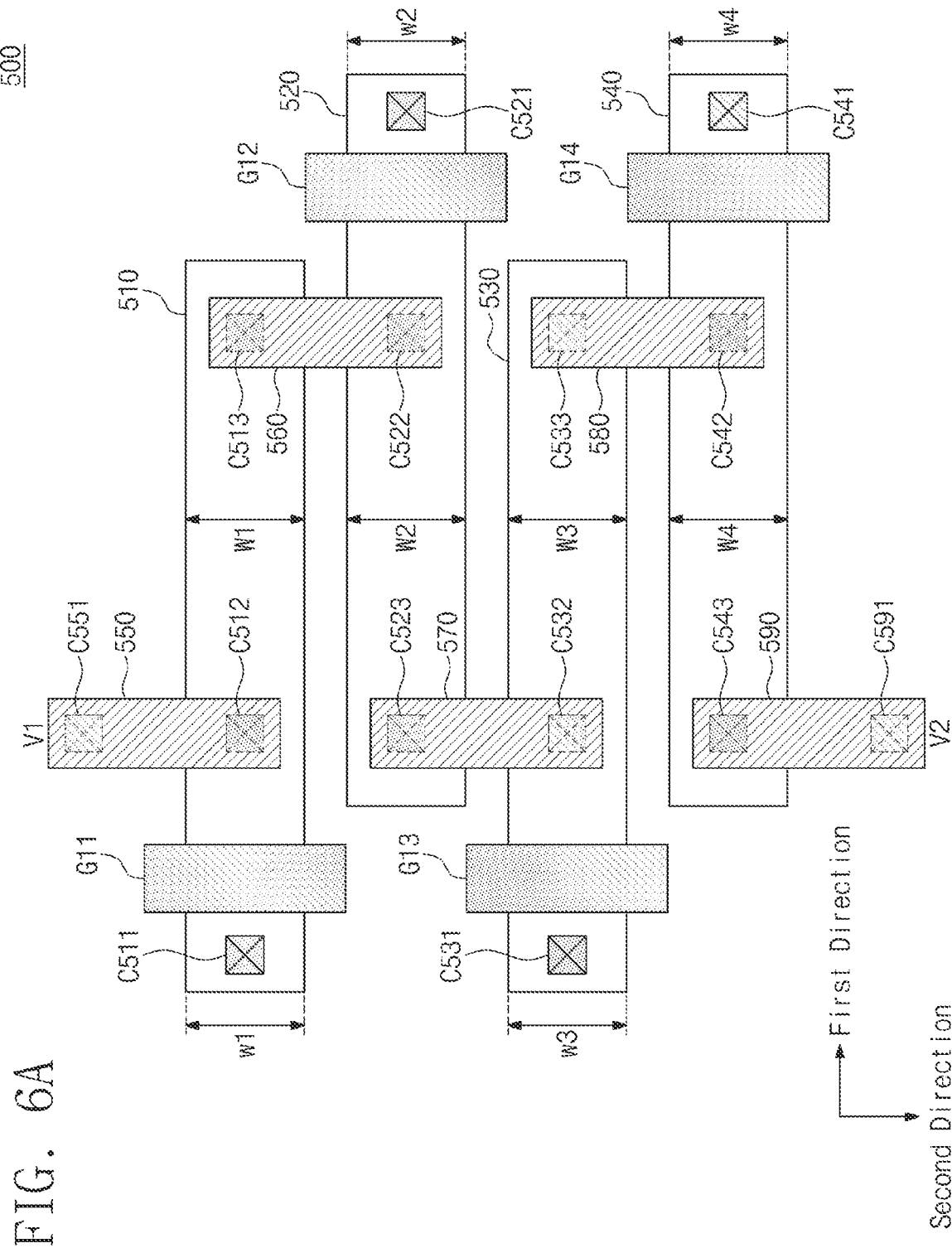
FIGS. 6A and 6B illustrate an integrated circuit including a plurality of sub-circuits according to embodiments of the inventive concept.
Figure 6B:
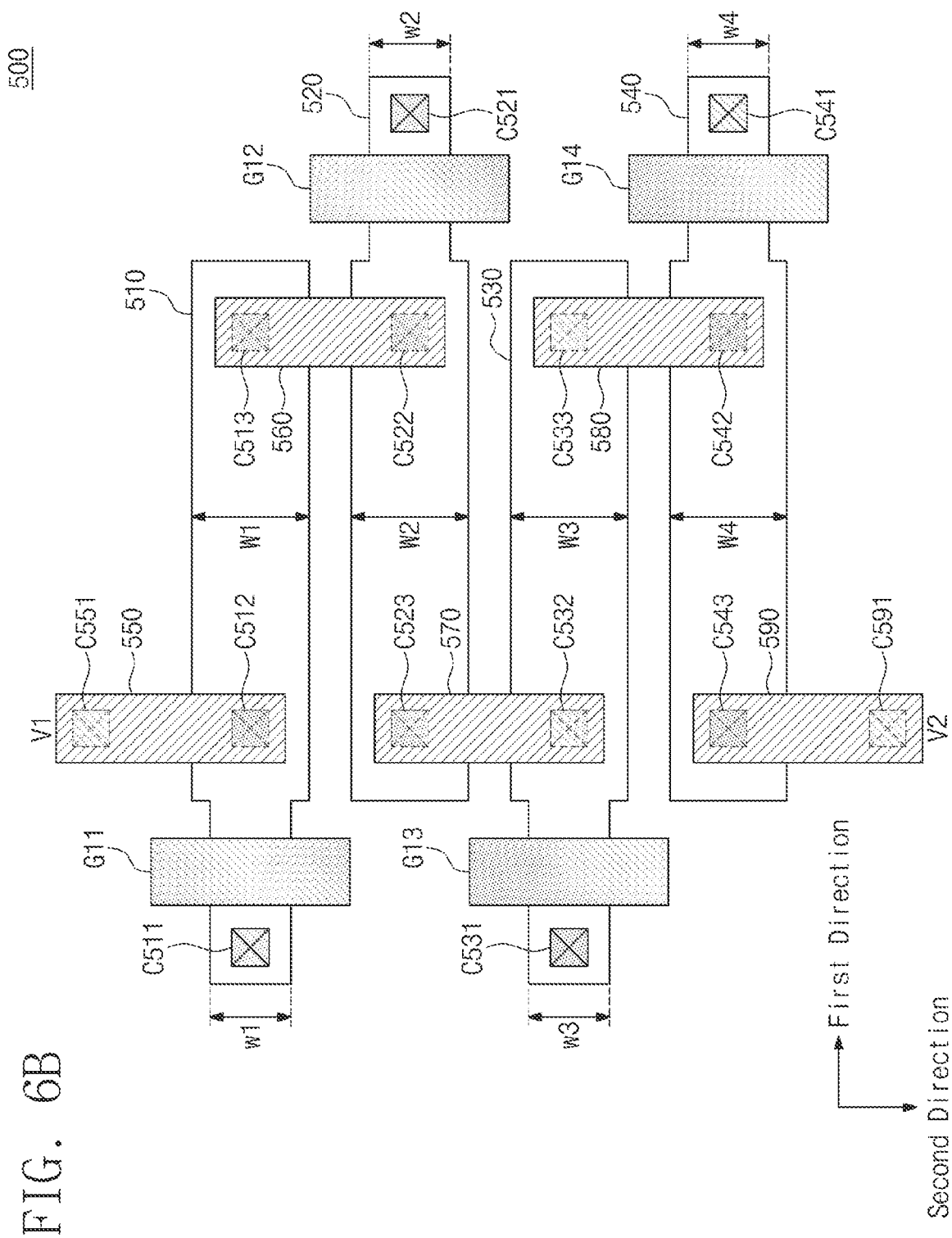

FIGS. 6A and 6B are respective layout views illustrating integrated circuits including a plurality of sub-circuits according to embodiments of the inventive concept. Referring to FIGS. 6A and 6B, an integrated circuit 500 may include first to fourth active regions 510, 520, 530, and 540, first to fourth gates G11, G12, G13, and G14, first to fourteenth contacts C511, C512, C513, C521, C522, C523, C531, C532, C533, C541, C542, C543, C551, and C591, first to fifth metal lines 550, 560, 570, 580, and 590, a device isolation layer (not illustrated), and a substrate (not illustrated). However, the number of active regions, the number of gates, the number of contacts, and the number of metal lines will vary by design.

The first active region 510, the first gate G11, the first to third contacts C511, C512, and C513 may constitute a first sub-circuit. The second active region 520, the second gate G12, the fourth to sixth contacts C521, C522, and C523 may constitute a second sub-circuit. The third active region 530, the third gate G13, the seventh to ninth contacts C531, C532, and C533 may constitute a third sub-circuit. The fourth active region 540, the fourth gate G14, the tenth to twelfth contacts C541, C542, and C543 may constitute a fourth sub-circuit. The respective configurations for each of the first to fourth sub-circuits may be substantially similar to the configuration of the integrated circuit 100 of FIGS. 2A, 2B and 2C.

The first sub-circuit may receive a first voltage V1 through the first metal line 550. The first voltage V1 may be a power supply voltage. The first metal line 550 may connect upper portions of the second contact C512 and the thirteenth contact C551. The thirteenth contact C551 may be connected to an input of the integrated circuit 500 to receive the first voltage V1 from the outside.

A first transistor may include the first gate G11 and may be connected to an external element through the first contact C511. The first gate G11 may receive an on/off signal of the first transistor. The first gate G11 and the first to third contacts C511, C512, and C513 may correspond to the gate 110 and the first to third contacts C110, C120, and C130 of FIG. 2A, respectively. Here, the second contact C512 may receive a voltage that is input to the first active region 510 where the second contact C512 is disposed.

The first to third contacts C511, C512, and C513 may be disposed on the first active region 510. That is, the first contact C511 may be disposed on a first junction area of the first active region 510, and the second contact C512 and the third contact C513 may be disposed on a second junction area of the first active region 510. The first active region 510 may include first to third nodes corresponding to the first to third contacts C511, C512, and C513, respectively.

The first to third nodes may be arranged in the first direction. A first active resistor may be interposed between the second node and the third node. The first active resistor may be electrically connected to the first transistor through the second junction area of the first active region 510. Below, an active region that electrically connects an active resistor and a transistor may mean a second junction area of the active region.

The first sub-circuit and a second sub-circuit may be connected through the second metal line 560. The second metal line 560 may be connected to upper portions of the third contact C513 and the fifth contact C522. A second transistor may include the second gate G12 and may be connected to an external element through the fourth contact C521. The second gate G12 may receive an on/off signal of the second transistor.

The second gate G12 and the fourth to sixth contacts C521, C522, and C523 may correspond to the first gate G11 and the first to third contacts C511, C512, and C513, respectively. Here, the fifth contact C522 may receive a voltage that is input to the second active region 520 where the fifth contact C522 is disposed.

The fourth to sixth contacts C521, C522, and C523 may be disposed on the second active region 520. That is, the fifth contact C521 may be disposed on a first junction area of the second active region 520, and the fifth contact C522 and the sixth contact C523 may be disposed on a second junction area of the second active region 520. The second active region 520 may include fourth to sixth nodes corresponding to the fourth to sixth contacts C521, C522, and C523, respectively.

The fourth to sixth nodes may be arranged in a direction facing away from the first direction. A second active resistor may be interposed between the fifth node and the sixth node. The second active resistor may be electrically connected to the second transistor through the second active region 520.

The second sub-circuit and a third sub-circuit may be connected through the third metal line 570. The third metal line 570 may be connected to upper portions of the sixth contact C523 and the eighth contact C532. A third transistor may include the third gate G13 and may be connected to an external element through the seventh contact C531. The third gate G13 may receive an on/off signal of the third transistor.

The third gate G13 and the seventh to ninth contacts C531, C532, and C533 may correspond to the first gate G11 and the first to third contacts C511, C512, and C513, respectively. Here, the eighth contact C532 may receive a voltage that is input to the third active region 530 where the eighth contact C532 is disposed.

The seventh to ninth contacts C531, C532, and C533 may be disposed on the third active region 530. That is, the seventh contact C531 may be disposed on a first junction area of the third active region 530, and the eighth contact C532 and the ninth contact C533 may be disposed on a second junction area of the third active region 530. The third active region 530 may include seventh to ninth nodes corresponding to the seventh to ninth contacts C531, C532, and C533, respectively.

The seventh to ninth nodes may be arranged in the first direction. A third active resistor may be interposed between the eighth node and the ninth node. The third active resistor may be electrically connected to the third transistor through the third active region 530.

The third sub-circuit and a fourth sub-circuit may be connected through the fourth metal line 580. The fourth metal line 580 may be connected to upper portions of the ninth contact C533 and the eleventh contact C542. A fourth transistor may include the fourth gate G14 and may be connected to an external element through the tenth contact C541. The fourth gate G14 may receive an on/off signal of the fourth transistor.

The fourth gate G14 and the tenth to twelfth contacts C541, C542, and C543 may correspond to the first gate G11 and the first to third contacts C511, C512, and C513, respectively. Here, the eleventh contact C542 may receive a voltage that is input to the fourth active region 540 where the eleventh contact C542 is disposed.

The tenth to twelfth contacts C541, C542, and C543 may be disposed on the fourth active region 540. That is, the tenth contact C541 may be disposed on a first junction area of the fourth active region 540, and the eleventh contact C542 and the twelfth contact C543 may be disposed on a second junction area of the fourth active region 540. The fourth active region 540 may include tenth to twelfth nodes corresponding to the tenth to twelfth contacts C541, C542, and C543, respectively.

The tenth to twelfth nodes may be arranged in the direction facing away from the first direction. A fourth active resistor may be interposed between the eleventh node and the twelfth node. The fourth active resistor may be electrically connected to the fourth transistor through the fourth active region 540.

The fourth sub-circuit may receive a second voltage V2 through the fifth metal line 590. The second voltage V2 may be a ground voltage GND. In this case, the fourth sub-circuit may be grounded through the fifth metal line 590. The fifth metal line 550 may be connected to upper portions of the twelfth contact C543 and the fourteenth contact C591.

Each of the first to fourth active regions 510, 520, 530, and 540 may include a first junction area corresponding to a source area and a second junction area corresponding to a drain area. Respective lengths of the first junction areas may be the same, and respective lengths of the second junction areas may be the same.

Widths (e.g., a first width w1, a second width w2, a third width w3, and a fourth width w4) of the first junction areas may be the same. (In this regard, a "width" is measured in the second direction, as compared with a "length which is measured in the first direction). However, in a case where the widths w1, w2, w3, and w4 of the first junction areas are different, issue(s)—such as irregular voltage division—may occur. Widths (e.g., a first width W1, a second width W2, a third width W3, and a fourth width W4) of the second junction areas may also be the same. However, in a case where the widths W1, W2, W3, and W4 of the second junction areas are different, issue(s)—such as irregular voltage division—may occur. Hence, in some embodiments, the respective widths w1, w2, w3, and w4 of the first junction areas may be the same as, or different from the respective widths W1, W2, W3, and W4 of the second junction areas.

Referring to FIG. 6B, the widths W1, W2, W3, and W4 of the second junction areas may change along the first direction. For example, each of the second junction areas may include a first portion being in contact with the corresponding one of the first to fourth gates G11, G12, G13, and G14 and a second portion where the corresponding one of the first to fourth active resistors is placed. Widths of the first portions may be the same as the widths w1, w2, w3, and w4 of the first junction areas. The widths W1, W2, W3, and W4 of the second junction areas may be different from the widths w1, w2, w3, and w4 of the first junction areas.

That is, in some embodiments, widths of the second portions may be different from the widths of the first portions. That is, the widths of the second portions may be greater than the widths of the first portions. Even in this case, the widths w1, w2, w3, and w4 of the first junction areas may be the same, and the widths W1, W2, W3, and W4 of the second junction areas may be the same.

The first to fourth active regions 510, 520, 530, and 540 may respectively include first to fourth active resistors, and resistance values of the first to fourth active resistors may be the same. The integrated circuit 500 may distribute a difference between the first voltage V1 and the second voltage V2 to the first to fourth active resistors. Because the resistance values of the first to fourth active resistors are the same, a voltage, of which a magnitude corresponds to one quarter of the difference between the first voltage V1 and the second voltage V2, may be distributed to the first to fourth active resistors.

The integrated circuit 500 may output a divided voltage through the third node N513, the sixth node N523, the ninth node N533, and the twelfth node N543. The integrated circuit 500 may sequentially activate the first to fourth gates G11, G12, G13, and G14 to output a stepwise increasing voltage.

However, the metal lines 550, 560, 570, 580, and 590 may include resistances. The resistances of the metal lines 550, 560, 570, 580, 590 may not be uniform due to an issue about a shape or a process of the metal lines 550, 560, 570, 580, 590. That is, the irregular resistances may cause a noise at an output voltage and may hinder a voltage from being uniformly divided. Also, the irregular resistances may cause a non-linearity issue in a voltage division system using a code control.

Therefore, there is a need to remove metal lines between sub-circuits, in addition to removing a metal line between a transistor and an active resistor as described with reference to FIG. 2A. Integrated circuits consistent with embodiments of the inventive concept may minimize the use of metal lines by connecting sub-circuits by using an active region, instead of a metal line. As such, the occurrence of a noise due to a metal line may be obviated.

Figure 7:
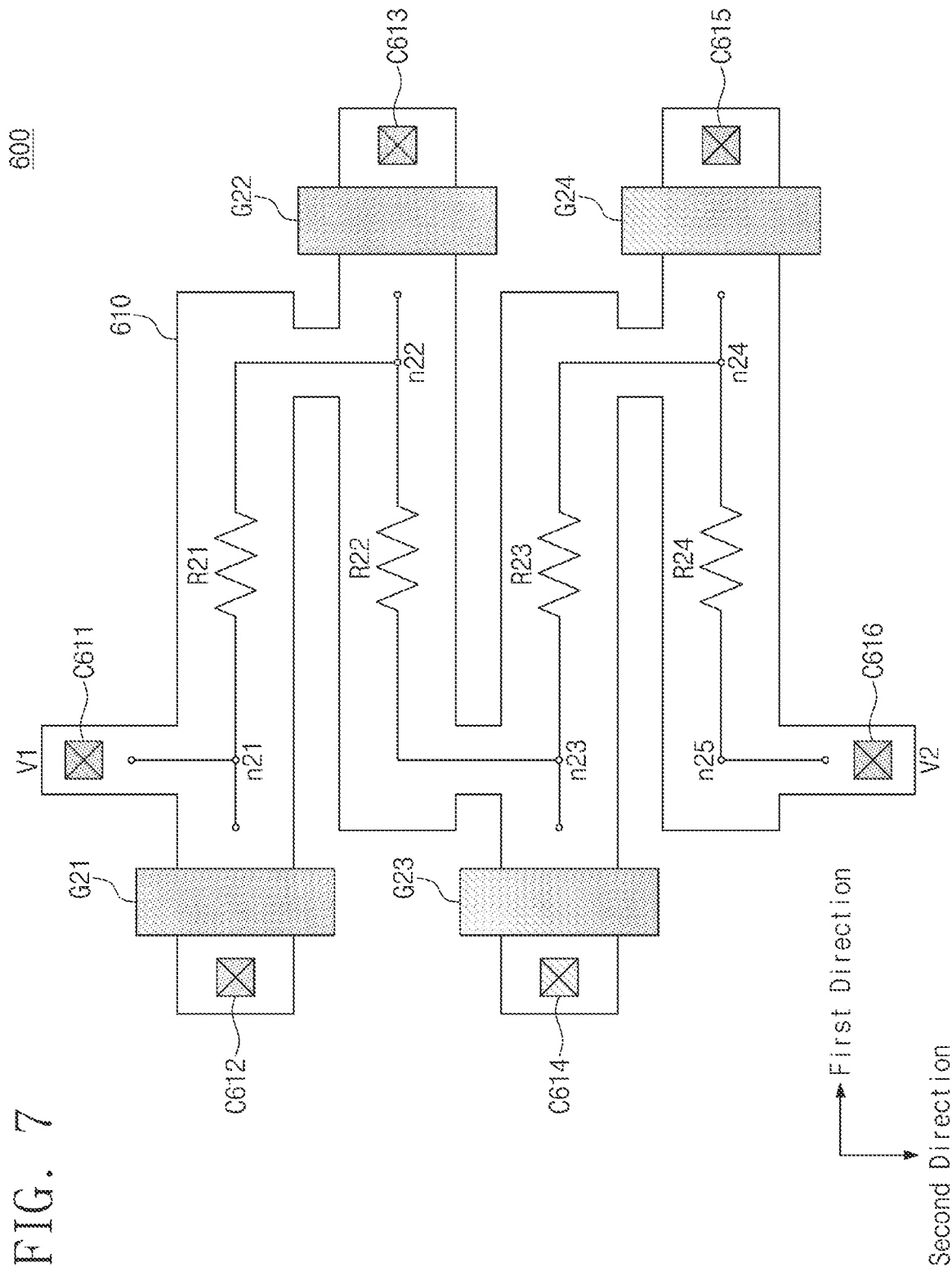
FIGS. 7, 8 and 9 variously illustrate integrated circuits including a plurality of gates according to embodiments of the inventive concept.
Figure 8:
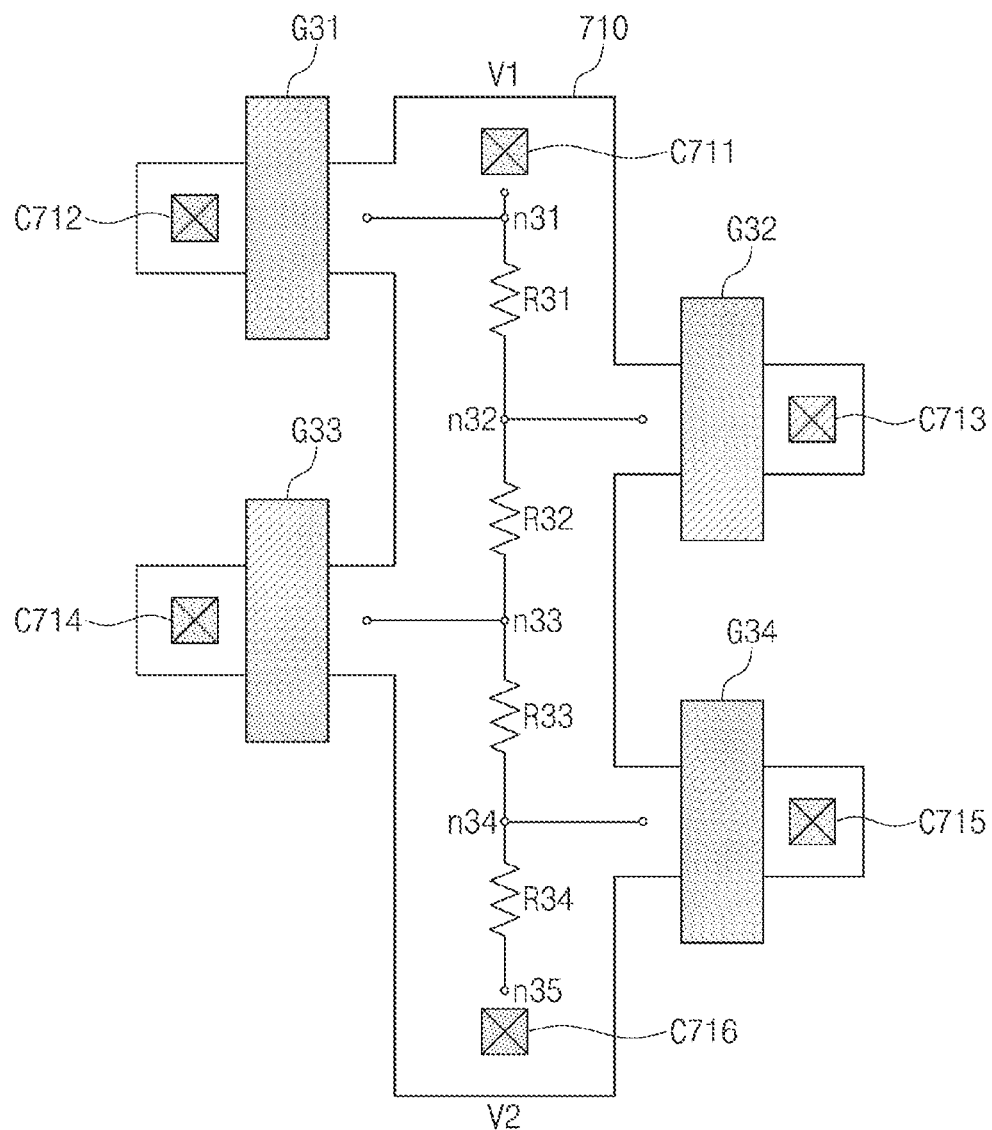
Figure 9:
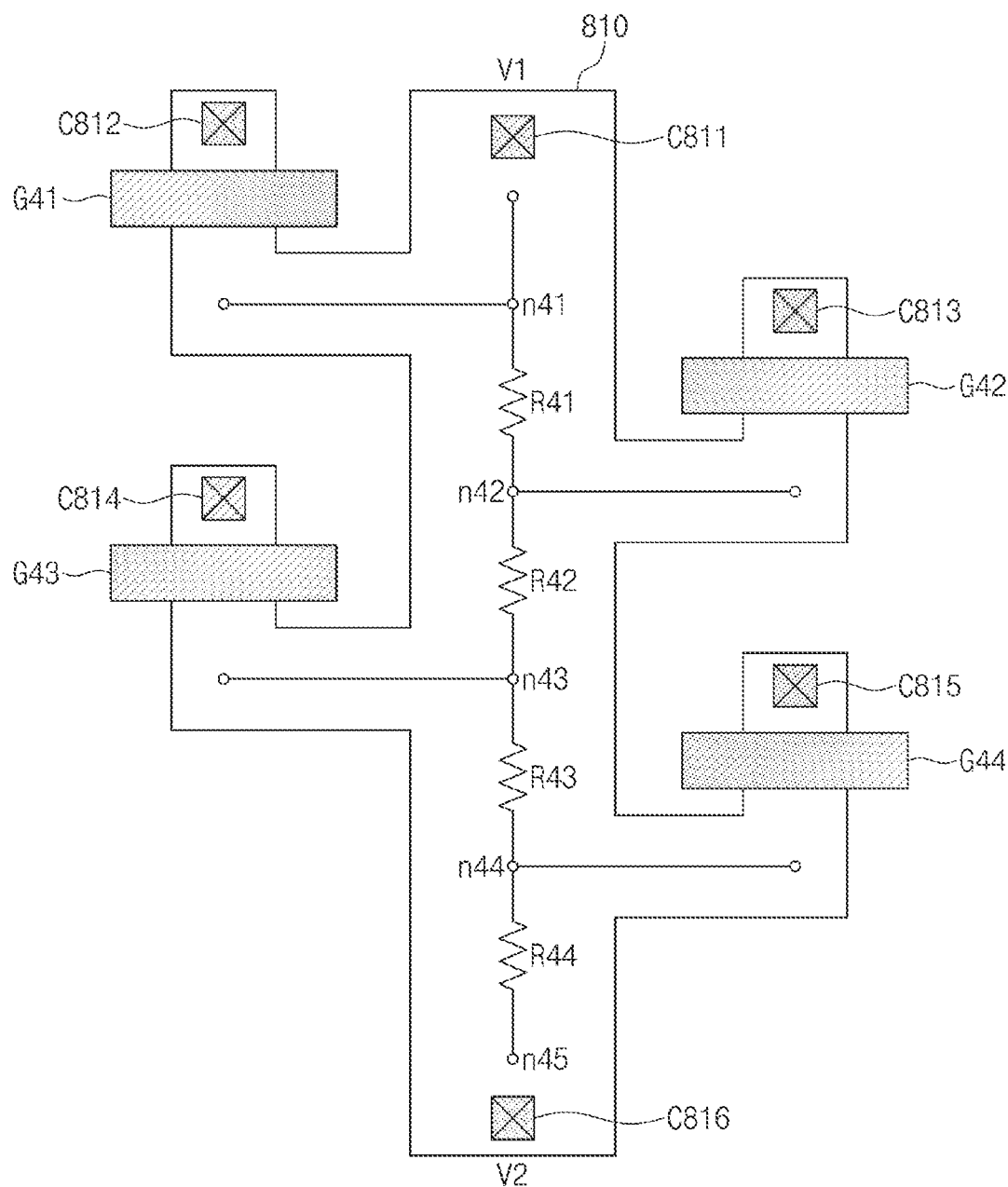

FIGS. 7, 8 and 9 are layout views illustrating integrated circuits according to embodiments of the inventive concept. FIGS. 7, 8 and 9 respectively illustrate integrated circuits 600, 700, and 800, wherein sub-circuits of the integrated circuit 500 illustrated in FIG. 6A are connected by active regions 610, 710, and 810 instead of the metal lines 550, 560, 570, 580, and 590.

Referring to FIG. 7, the integrated circuit 600 may include an active region 610, first to fourth gates G21, G22, G23, and G24, first to sixth contacts C611, C612, C613, C614, C615, and C616, a device isolation layer (not illustrated), and a substrate (not illustrated). However, the number of active regions, the number of gates, and the number of contacts will vary by design.

The first to fourth gates G21, G22, G23, and G24 and the first to sixth contacts C611, C612, C613, C614, C615, and C616 of FIG. 7 may correspond to the first to fourth gates G11, G12, G13, and G14 and the thirteenth, first, fourth, sixth, tenth, and fourteenth contacts C551, C511, C521, C531, C541, and C591 of FIG. 6A, respectively.

The active region 610 may be formed on the substrate and may be defined by the device isolation layer. The first to fourth gates G21, G22, G23, and G24 and the first to sixth contacts C611, C612, C613, C614, C615, and C616 may be disposed on the active region 610.

The first to fourth gates G21, G22, G23, and G24 may be included in the first to fourth transistors, respectively. The first to fourth gates G21, G22, G23, and G24 may receive ON/OFF signals of the first to fourth transistors, respectively. The first to sixth contacts C611, C612, C613, C614, C615, and C616 may be connected to external elements, respectively.

The active region 610 may include a plurality of first junction areas and a second junction area. The plurality of first junction areas may correspond to source areas of the first to fourth transistors, respectively. The second junction area may include drain areas of the first to fourth transistors. The drain areas may be shared through the second junction area. That is, the second junction area may be implemented by integrating the drain areas of the first to fourth transistors. A source area and a drain area may be interchangeable.

The second junction area of the active region 610 may include a plurality of nodes including first to fifth nodes n21, n22, n23, n24, and n25. First to fourth active resistors R21, R22, R23, and R24 may be disposed between the first to fifth nodes n21, n22, n23, n24, and n25. The first to fourth active resistors R21, R22, R23, and R24 may have the same size. The first to fourth active resistors R21, R22, R23, and R24 may be electrically connected to the first to fourth transistors through the active region 610.

Referring to FIG. 7, the second junction area of the active region 610 is connected to the first contact C611 receiving the first voltage V1 and the sixth contact C616 receiving the second voltage V2. In some embodiments, additional contacts may be placed at locations respectively corresponding to the first to fifth nodes n21, n22, n23, n24, and n25, and the integrated circuit 600 may output a divided voltage through the additional contacts.

Referring to FIGS. 7 and 8, the integrated circuit 700 may include an active region 710, first to fourth gates G31, G32, G33, and G34, first to sixth contacts C711, C712, C713, C714, C715, and C716, a device isolation layer (not illustrated), and a substrate (not illustrated). The integrated circuit 700 may be substantially similar to the integrated circuit 600 of FIG. 7, except for the overall shape of the active region 710.

The first to fourth gates G31, G32, G33, and G34 and the first to sixth contacts C711, C712, C713, C714, C715, and C716 of FIG. 8 may correspond to the first to fourth gates G21, G22, G23, and G24 and the first to sixth contacts C611, C612, C613, C614, C615, and C616 of FIG. 7, respectively.

The first to fourth gates G21, G22, G23, and G24 may be included in the first to fourth transistors, respectively. Each of the first to fourth transistors may include a first junction area corresponding to a source area. Each of the first to fourth transistors may include a second junction area corresponding to a drain area.

The source areas of the first to fourth transistors may be spaced from each other. The drain areas of the first to fourth transistors may be shared through the second junction area. The second junction area may be single and may be shared by the drain areas.

The second junction area may include an extension elongated in the second direction. The extension may include first to fifth nodes n31, n32, n33, n34, and n35 arranged in the second direction, and first to fourth active resistors R31, R32, R33, and R34 disposed between the first to fifth nodes n31, n32, n33, n34, and n35.

Sizes of the first to fourth active resistors R31, R32, R33, and R34 may be the same. The extension may include the first contact C711 and the sixth contact C716, and a difference between the first voltage V1 of the first contact C711 and the second voltage V2 of the sixth contact C716 may be uniformly divided by the first to fourth active resistors R31, R32, R33, and R34.

The second junction area may include a plurality of protrusions extending in the positive first direction or the negative first direction. The plurality of protrusions may extend from locations respectively corresponding to the first to fourth nodes n31, n32, n33, and n34 in the positive first direction or the negative first direction.

For example, a first protrusion may extend from the first node n31 in the negative first direction and may be electrically connected to the first transistor. A second protrusion may extend from the second node n32 in the positive first direction and may be electrically connected to the second transistor. A third protrusion may extend from the third node n33 in the negative first direction and may be electrically connected to the third transistor. A fourth protrusion may extend from the fourth node n34 in the positive first direction and may be electrically connected to the fourth transistor.

A length of a protrusion may be less than a width of the extension. That is, a width of the second junction area may be greater than a length of the second junction area. As a result, the active region 710 may generally extend in the second direction. In this case, the integrated circuit 700 may minimize length(s).

The first to fourth transistors may be arranged in the first direction. Here, when a transistor is said to be "arranged in the first direction" denotes an arrangement of a source area and a drain area in the first direction with respect to a gate.

In this regard, a direction in which the first to fourth transistors are arranged may be perpendicular to a direction in which the second junction area of the active region 710 extend.

The first to fourth gates G31, G32, G33, and G34 may extend in a direction perpendicular to the arrangement direction of the first to fourth transistors. That is, the first to fourth gates G31, G32, G33, and G34 may extend in the second direction. A direction in which the first to fourth gates G31, G32, G33, and G34 extend may be parallel to the direction in which the second junction area of the active region 710 extend.

Referring to FIG. 9, the integrated circuit 800 may include an active region 810, first to fourth gates G41, G42, G43, and G44, first to sixth contacts C811, C812, C813, C814, C815, and C816, a device isolation layer (not illustrated), and a substrate (not illustrated). The integrated circuit 800 may be substantially similar to the integrated circuit 700 of FIG. 8, except for the direction in which the first to fourth gates G41, G42, G43, and G44 are arranged.

The active region 810, the first to fourth gates G41, G42, G43, and G44, the first to sixth contacts C811, C812, C813, C814, C815, and C816, first to fifth nodes n41, n42, n43, n44, and n45, and first to fourth active resistors R41, R42, R43, and R44 of FIG. 9 may correspond to the active region 710, the first to fourth gates G31, G32, G33, and G34, the first to sixth contacts C711, C712, C713, C714, C715, and C716, the first to fifth nodes n31, n32, n33, n34, and n35, and the first to fourth active resistors R31, R32, R33, and R34 of FIG. 8, respectively.

The first to fourth transistors may be arranged in the second direction. That is, a direction in which the first to fourth transistors are arranged may be parallel to a direction in which the second junction area of the active region 810 extend.

The first to fourth gates G41, G42, G43, and G44 may extend in a direction perpendicular to the direction in which the first to fourth transistors are arranged. That is, the first to fourth gates G41, G42, G43, and G44 may extend in the first direction. A direction in which the first to fourth gates G41, G42, G43, and G44 extend may be perpendicular to the direction in which the second junction area of the active region 810 extend.

As illustrated in FIGS. 7, 8 and 9, an active region according to embodiments of the inventive concept may generally extend in the first direction or the second direction. An active region may replace metal lines connecting sub-circuits in order to minimize the influence of a noise associated with the metal lines. In additional, sine the metal lines are removed, the overall size of the integrated circuit may be reduced, and thereby a semiconductor device incorporating the integrated circuit may be implemented with a reduced size.

Figure 10:
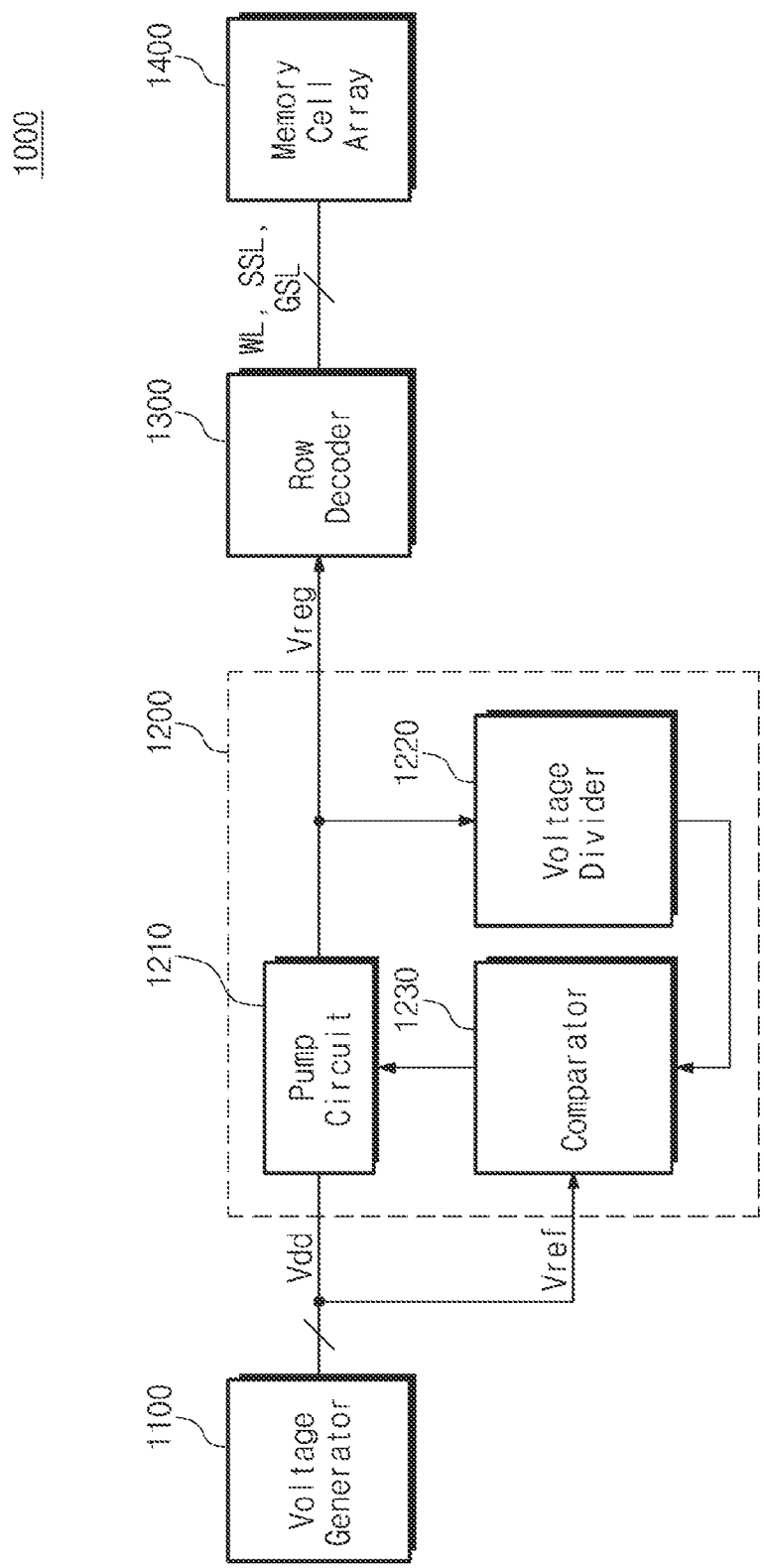
FIG. 10 is a block diagram illustrating a nonvolatile memory device including an integrated circuit according to embodiments of the inventive concept.

FIG. 10 is a block diagram illustrating a nonvolatile memory device 1000 incorporating an integrated circuit according to embodiments of the inventive concept. Here, the nonvolatile memory device 1000 may include a programmable ROM (PROM) device, an erasable PROM (EPROM) device, an electrically erasable and programmable ROM (EEPROM) device, a flash memory device, etc.

The flash memory device may use an "incremental step pulse programming (ISPP)" manner for the purpose of making a threshold voltage distribution of memory cells dense in a program operation. That is, in the program operation, the flash memory device may not apply a word line voltage to a memory cell once, but the flash memory device may stepwise increase a word line voltage.

Referring to FIG. 10, the nonvolatile memory device 1000 may include a voltage generator 1100, a voltage regulator 1200, a row decoder 1300, and a memory cell array 1400. The nonvolatile memory device 1000 may provide a stepwise increasing word line voltage to a memory cell.

The voltage generator 1100 may apply a power supply voltage Vdd and a reference voltage Vref to the voltage regulator 1200, and the voltage regulator 1200 may transfer a regulated voltage Vreg to the row decoder 1300 based on the power supply voltage Vdd and the reference voltage Vref. The voltage regulator 1200 may include a charge pump circuit 1210, a voltage divider 1220, and a comparator 1230.

The charge pump circuit 1210 may generate the regulated voltage Vreg as an output voltage. When the output voltage is smaller than a target voltage, the charge pump circuit 1210 may operate; when the output voltage reaches the target voltage, the charge pump circuit 1210 may not operate. Through the above process, the regulated voltage Vreg may be generated as a target output voltage.

The voltage divider 1220 may output a division voltage. To stepwise increase the output voltage, the voltage divider 1220 may include a plurality of resistors that are respectively selected in response to step control signals that are sequentially activated. The voltage divider 1220 may generate the division voltage by dividing the output voltage depending on a ratio of resistance values of the plurality of resistors. To linearly increase the output voltage, the voltage divider 1220 may be implemented with the integrated circuit 100 according to an embodiment of the inventive concept.

The comparator 1230 may compare the reference voltage Vref and the division voltage and may turn on or turn off the charge pump circuit 1210 based on a result of the comparison. As such, a target output voltage may be generated.

The row decoder 1300 may be connected to the memory cell array 1400 through a plurality of string selection lines SSLs, a plurality of word lines WLs, and a plurality of ground selection lines GSLs. The row decoder 1300 may decode an address to control the plurality of string selection lines SSLs, the plurality of word lines WLs, and the plurality of ground selection lines GSLs. For example, the row decoder 1300 may select one or more of the plurality of word lines WLs. The row decoder 1300 may supply the regulated voltage Vreg to the selected word line. The regulated voltage Vreg may correspond to a voltage that is adjusted to various levels by the voltage regulator 1200.

The memory cell array 1400 may include a plurality of memory cells that are respectively disposed at intersections of the plurality of word lines WLs and a plurality of bit lines BLs. The plurality of memory cells may form a plurality of memory blocks BLK1, BLK2, and BLKz. The plurality of memory cells may be connected to the plurality of word lines WLs.

In some embodiments the voltage regulator 1200 may be included in the nonvolatile memory device 1000, as illustrated in FIG. 10, but the inventive concept is not limited thereto.

Figure 11:
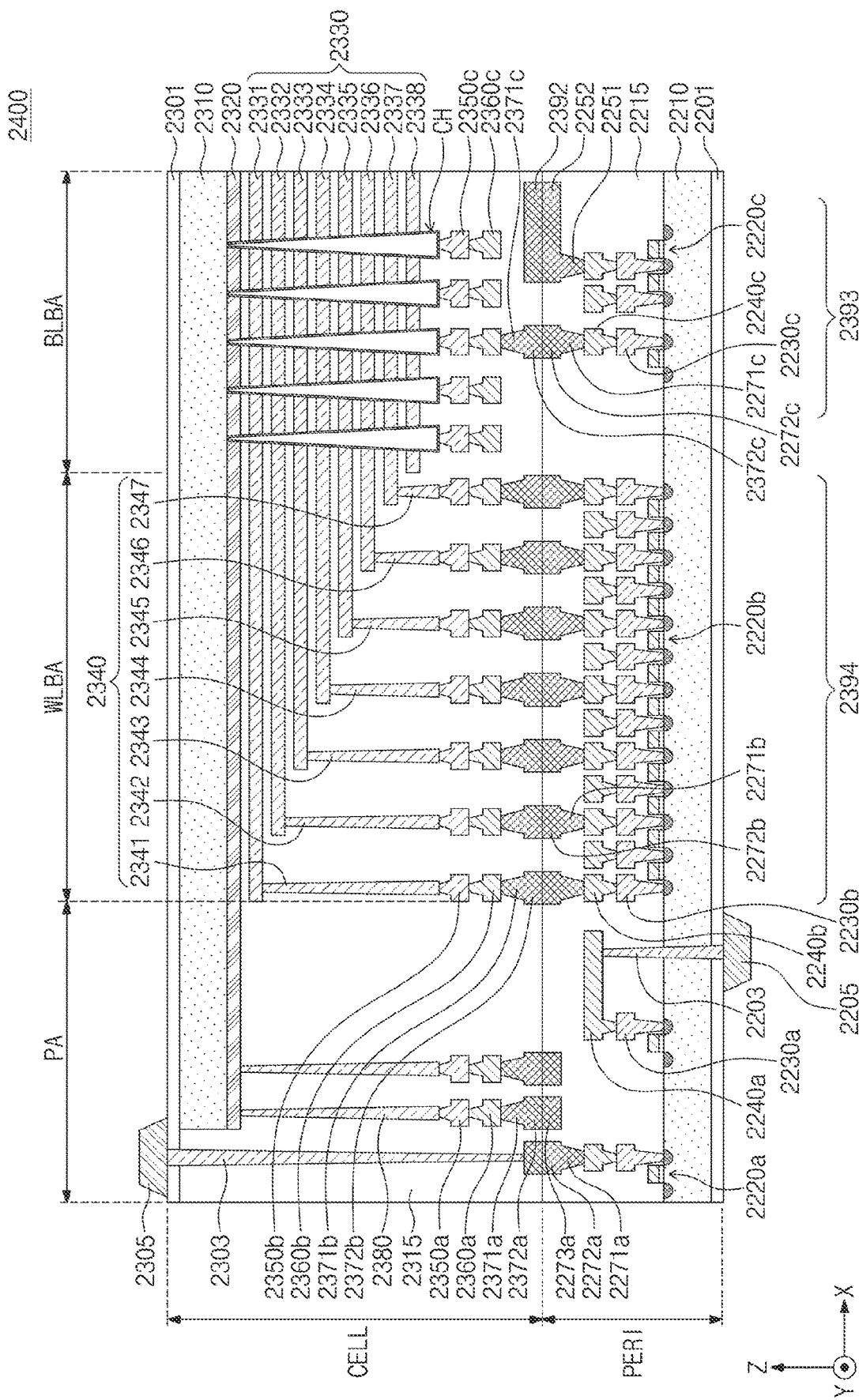
FIG. 11 is a diagram illustrating a memory device according to another embodiment of the inventive concept.

FIG. 11 is a cross-sectional diagram illustrating a memory device according to embodiments of the inventive concept.

Referring to FIG. 11, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a manner of electrically connecting a bonding metal formed on an uppermost metal layer of the upper chip and a bonding metal formed on an uppermost metal layer of the lower chip. For example, the bonding metal may include copper (Cu) for Cu-to-Cu bonding. However, an embodiment is not limited thereto. For example, the bonding metal may be formed of aluminum (Al) or tungsten (W).

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an embodiment, the first metal layers 2230a, 2230b, and 2230c may be formed of tungsten having a relatively high resistance, and the second metal layers 2240a, 2240b, and 2240c may be formed of copper having a relatively low resistance.

Here, the first metal layers 2230a, 2230b, and 2230c and the second metal layers 2240a, 2240b, and 2240c are shown and described, but the inventive concept is not limited thereto. For example, one or more metal layers may be further formed on the second metal layers 2240a, 2240b, and 2240c. At least a part of the one or more metal layers formed on the second metal layers 2240a, 2240b, and 2240c may be formed of aluminum or the like having a lower resistance than that of copper forming the second metal layers 2240a, 2240b, and 2240c.

The interlayer insulating layer 2215 may be disposed on the first substrate 2210 to cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to upper bonding metals 2371b and 2372b of the cell region CELL by Cu—Cu bonding. The lower bonding metals 2271b and 2272b and the upper bonding metals 2371b and 2372b may be formed of aluminum, copper, or tungsten.

Also, the upper bonding metals 2371b and 2372b in the cell region CELL may be referred as first metal pads, and the lower bonding metals 2271b and 2272b in the peripheral circuit region PERI may be referred as second metal pads.

The cell region CELL may include at least one memory block. The cell region CELL may include a second substrate 2310, an interlayer insulating layer 2315, and a common source line 2320. On the second substrate 2310, a plurality of word lines 2331 to 2338 (i.e., 2330) may be stacked in a vertical direction (e.g., a Z direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection lines.

Here, lengths of the plurality of word lines 2330 may vary. As a distance from the first substrate 2221 of the peripheral circuit region PERI to respective a word line among the plurality of word lines 2330 increases, the length of the respective word lines 2330 decreases. Similarly, as a distance from the second substrate 2310 of the cell region CELL to a word line among the plurality of word liens 2330 increases, the length of the word line 2330 increases.

In the bit line bonding area BLBA, a channel structure CH may vertically extend and may pass through the plurality of word lines 2330, the string selection lines, and the ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an embodiment, the bit line 2360c may extend in the second direction (e.g., the Y direction) parallel to the upper surface of the second substrate 2310.

The interlayer insulating layer 2315 may be disposed on the second substrate 2310 to cover the common source line 2320, the plurality of word lines 2330, a plurality of cell contact plugs 2340, first metal layers 2350a, 2350b, and 2350c, and second metal layers 2360a, 2360b, and 2360c. The interlayer insulating layer 2315 may include an insulating material such as silicon oxide, silicon nitride, or the like.

In the illustrated example of FIG. 11, an area in which the channel structure CH, the bit line 2360c, and the like are disposed may be defined as the bit line bonding area BLBA. In the bit line bonding area BLBA, the bit line 2360c may be electrically connected to the circuit elements 2220c constituting a page buffer 2393 in the peripheral circuit region PERI. The bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a first direction (e.g., the X direction) perpendicular to the second direction and parallel to the upper surface of the second substrate 2310 and may be connected to a plurality of cell contact plugs 2341 to 2347 (i.e., 2340). The word lines 2330 and the cell contact plugs 2340 may be connected to each other at pads provided by at least some of the plurality of word lines 2330, which extend in the second direction with different lengths. The first metal layer 2350b and the second metal layer 2360b may be sequentially connected to an upper portion of each of the cell contact plugs 2340 connected to the word lines 2330. The cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected to the circuit elements 2220b constituting a row decoder 2394 in the peripheral circuit region PERI. In some embodiments, the operating voltages of the circuit elements 2220b constituting the row decoder 2394 may be different from operating voltages of the circuit elements 2220c constituting the page buffer 2393. For example, operating voltages of the circuit elements 2220c constituting the page buffer 2393 may be greater than operating voltages of the circuit elements 2220b constituting the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected to the common source line 2320. The first metal layer 2350a and the second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

Additionally, input/output (I/O) pads 2205 and 2305 may be disposed in the external pad bonding area PA. Referring to FIG. 11, a lower insulating film 2201 covering a lower surface of the first substrate 2210 may be formed below the first substrate 2210, and the first I/O pad 2205 may be formed on the lower insulating film 2201. The first I/O pad 2205 may be connected to at least one of the plurality of circuit elements 2220a, 2220b, and 2220c disposed in the peripheral circuit region PERI through a first I/O contact plug 2203 and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

Referring to FIG. 11, an upper insulating film 2301 covering the upper surface of the second substrate 2310 may be formed on the second substrate 2310, and the second I/O pad 2305 may be disposed on the upper insulating film 2301. The second I/O pad 2305 may be connected to at least one of the plurality of circuit elements 2220a, 2220b, and 2220c disposed in the peripheral circuit region PERI through a second I/O contact plug 2303 and lower bonding metals 2271a and 2272a of the peripheral circuit region PERI. In an embodiment, the second I/O pad 2305 may be electrically connected to the circuit element 2220a.

In some embodiments, the second substrate 2310 and the common source line 2320 may not be disposed in an area in which the second I/O contact plug 2303 is disposed. Also, the second I/O pad 2305 may not overlap the word lines 2330 in the third direction (e.g., the Z direction). Referring to FIG. 11, the second I/O contact plug 2303 may be separated from the second substrate 2310 in a direction parallel to the upper surface of the second substrate 2310, may pass through the interlayer insulating layer 2315 of the cell region CELL, and may be connected to the second I/O pad 2305.

Here, the first I/O pad 2205 and the second I/O pad 2305 may be selectively formed. For example, the memory device 2400 may include only the first I/O pad 2205 disposed on the first substrate 2210 or the second I/O pad 2305 disposed on the second substrate 2310. Alternatively, the memory device 2400 may include both the first I/O pad 2205 and the second I/O pad 2305.

In each of the external pad bonding area PA and the bit line bonding area BLBA respectively included in the cell region CELL and the peripheral circuit region PERI, a metal pattern in the uppermost metal layer may be provided as a dummy pattern, or the uppermost metal layer may be absent.

In the external pad bonding area PA, the memory device 2400 may include a lower metal pattern 2273a in the uppermost metal layer of the peripheral circuit region PERI, and the lower metal pattern 2273a may correspond to an upper metal pattern 2372a formed in the uppermost metal layer of the cell region CELL and may have the same shape as the upper metal pattern 2372a of the cell region CELL. In the peripheral circuit region PERI, the lower metal pattern 2273a formed in the uppermost metal layer of the peripheral circuit region PERI may not be connected to a contact. As in the above description, in the external pad bonding area PA, the upper metal pattern 2372a that corresponds to the lower metal pattern 2273a formed in the uppermost metal layer of the peripheral circuit region PERI and has the same shape as the lower metal pattern 2273a of the peripheral circuit region PERI may be formed in the uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by Cu—Cu bonding.

Also, in the bit line bonding area BLBA, an upper metal pattern 2392 that corresponds to a lower metal pattern 2252 formed in the uppermost metal layer of the peripheral circuit region PERI and has the same shape as the lower metal pattern 2252 of the peripheral circuit region PERI may be formed in the uppermost metal layer of the cell region CELL. A contact may not be formed on the upper metal pattern 2392 formed in the uppermost metal layer of the cell region CELL.

In an embodiment, a reinforce metal pattern that corresponds to a metal pattern formed in an uppermost metal layer of one of the cell region CELL and the peripheral circuit region PERI and has the same shape as the metal pattern may be formed in an uppermost metal layer of the other of the cell region CELL and the peripheral circuit region PERI. A contact pattern may not be formed on the reinforce metal pattern.

In some embodiments, an integrated circuit described with reference to FIGS. 1A to 9 may be included in the peripheral circuit region PERI of FIG. 11.

According to embodiments of the inventive concept, an integrated circuit may obviate the noise associated with metal line(s) by extending an active region, such that a junction area of a transistor including a plurality of nodes. As a semiconductor device is implemented by using the integrated circuit, a layout size of a semiconductor device including the integrated circuit may be reduced.

While the inventive concept has been described with reference to embodiments thereof, it will be apparent to those of ordinary skill in the art that various changes and modifications may be made thereto without departing from the spirit and scope of the inventive concept as set forth in the following claims.

What is claimed is:

1. An integrated circuit comprising:
a substrate including a single active region;
a first active resistor formed on the substrate; and
a transistor including a first junction area in the single active region,
wherein the first active resistor and the transistor are electrically connected through the first junction area,
the first active resistor is formed between a first node and a second node included in the first junction area,
the first node is connected to a first contact, and
the second node is connected to a second contact.

2. The integrated circuit of claim 1, wherein the single active region is defined by a single device isolation layer.

3. The integrated circuit of claim 1, wherein the first junction area extends in a first direction from a first end of a gate included in the transistor to the second contact, and
the first contact and the second contact are arranged in the first direction and disposed on the first junction area.

4. The integrated circuit of claim 3, wherein a size of the first active resistor is proportional to a length of the first junction area in the first direction.

5. The integrated circuit of claim 3, wherein the first junction area further extends in the first direction from the second contact to a third contact to include a third node connected to the third contact.

6. The integrated circuit of claim 5, wherein a second active resistor is formed between the second node and the third node, and
a first voltage input to the first node is divided in accordance with a resistance ratio between the first active resistor and the second active resistor.

7. The integrated circuit of claim 3, wherein the first junction area further extends in a second direction perpendicular to the first direction from the second contact to a fourth contact to include a fourth node connected to the fourth contact.

8. The integrated circuit of claim 7, wherein a third active resistor is formed between the second node and the fourth node, and
a first voltage input to the first node is divided in accordance with a resistance ratio between the first active resistor and the third active resistor.

9. The integrated circuit of claim 1, wherein the first junction area extends in a positive first direction from a first end of a gate included in the transistor to include the second contact, and the integrated circuit further comprises:
a second junction area included in the single active region and extending in a negative first direction from a second end of the gate included in the transistor to include a fifth node and a sixth node,
wherein the fifth node is connected to a fifth contact,
the sixth node is connected to a sixth contact, and
the fifth contact and the sixth contact are arranged in the negative first direction.

10. The integrated circuit of claim 9, wherein a fourth active resistor is formed between the fifth node and the sixth node, and
the fourth active resistor and the transistor are electrically connected through the second junction area.

11. An integrated circuit comprising:
a substrate including a single active region;
a plurality of active resistors formed on the substrate; and
a plurality of transistors sharing a first junction area included in the single active region,
wherein the plurality of active resistors and the plurality of transistors are electrically connected through the first junction area,
the first junction area includes a plurality of nodes, and
each one of the plurality of active resistors is alternately disposed with each one of the plurality of nodes.

12. The integrated circuit of claim 11, wherein the plurality of active resistors have a same size.

13. The integrated circuit of claim 11, wherein the first junction area extends in a first direction, and
each of the plurality of transistors further includes a gate that extends in one of the first direction and a second direction perpendicular to the first direction.

14. The integrated circuit of claim 11, wherein the plurality of nodes includes a first node, a second node, and at least one additional node,
the first node is connected to a first contact,
the second node is connected to a second contact, and
the at least one additional node is disposed between the first node and the second node.

15. The integrated circuit of claim 14, wherein each one of the plurality of transistors is connected to the first node and the at least one additional node.

16. The integrated circuit of claim 14, wherein the first junction area extends in a first direction from the first contact to the second contact, and the plurality of nodes and the plurality of active resistors are arranged in the first direction.

17. The integrated circuit of claim 14, wherein a difference between a first voltage of the first node and a second voltage of the second node is identically divided by each one of the plurality of active resistors.

18. A semiconductor device comprising:

a substrate including a single active region;

a plurality of sub-circuits, wherein the semiconductor device distributes a uniform voltage to each one of the plurality of sub-circuits, each one of the plurality of sub-circuits includes an active resistor formed on the substrate, and a transistor including a first junction area included in the single active region, the active resistor and the transistor are electrically connected through the first junction area, the first junction area includes a first node and a second node, and the active resistor is formed between the first node and the second node.

19. The semiconductor device of claim 18, wherein each active resistor included in each one of the plurality of sub-circuits has a same size.

20. The semiconductor device of claim 18, wherein the plurality of sub-circuits are electrically connected through at least one of a metal line or the first junction area.

* * * * *